United States Patent
Kuruc et al.

(10) Patent No.: US 8,946,002 B2
(45) Date of Patent: Feb. 3, 2015

(54) METHOD OF FORMING A SEMICONDUCTOR DEVICE HAVING A PATTERNED GATE DIELECTRIC AND STRUCTURE THEREFOR

(75) Inventors: Marian Kuruc, Piestany (SK); Juraj Vavro, Piestany (SK)

(73) Assignee: Semiconductor Components Industries, LLC, Phoenix, AZ (US)

( * ) Notice: Subject to any disclaimer, the term of this patent is extended or adjusted under 35 U.S.C. 154(b) by 79 days.

(21) Appl. No.: 13/556,989

(22) Filed: Jul. 24, 2012

(65) Prior Publication Data

US 2014/0027813 A1 Jan. 30, 2014

(51) Int. Cl.
*H01L 21/331* (2006.01)
*H01L 29/66* (2006.01)
*H01L 29/08* (2006.01)

(52) U.S. Cl.
CPC ....... *H01L 29/66348* (2013.01); *H01L 29/0834* (2013.01)
USPC ................... 438/138; 257/139; 257/E21.384; 257/E29.198

(58) Field of Classification Search
CPC ..................... H01L 29/7813; H01L 29/66734; H01L 29/7827; H01L 29/407; H01L 29/0878; H01L 29/41766; H01L 29/7811; H01L 29/78; H01L 29/42368; H01L 29/0696; H01L 29/1095; H01L 29/66666; H01L 29/872; H01L 27/1203; H01L 29/0653; H01L 2924/00; H01L 29/0619; H01L 29/4236; H01L 29/0634; H01L 29/0638; H01L 29/41741; H01L 27/10826; H01L 27/1087; H01L 27/10879; H01L 29/0847; H01L 29/66348; H01L 29/732

USPC ............ 257/330, E21.41, E29.262, E27.016, 257/E27.062, E21.24; 438/589, 478, 98, 438/287, 382, 571, 591

See application file for complete search history.

(56) References Cited

U.S. PATENT DOCUMENTS

| | | | |
|---|---|---|---|
| 4,992,390 A | 2/1991 | Chang | |
| 4,994,871 A | 2/1991 | Chang et al. | |
| 5,329,142 A | 7/1994 | Kitagawa et al. | |
| 5,591,301 A * | 1/1997 | Grewal | 438/729 |
| 5,751,024 A | 5/1998 | Takahashi | |
| 6,265,742 B1 * | 7/2001 | Gruening et al. | 257/304 |
| 6,359,308 B1 * | 3/2002 | Hijzen et al. | 257/341 |
| 6,444,528 B1 | 9/2002 | Murphy | |
| 6,617,624 B2 * | 9/2003 | Powell | 257/288 |
| 6,621,112 B2 * | 9/2003 | Jaiprakash et al. | 257/301 |
| 6,815,769 B2 * | 11/2004 | Pfirsch et al. | 257/341 |
| 6,846,569 B2 * | 1/2005 | Hu et al. | 428/450 |
| 6,894,353 B2 * | 5/2005 | Samavedam et al. | 257/365 |
| 6,979,621 B2 * | 12/2005 | Hshieh et al. | 438/270 |
| 7,443,225 B2 * | 10/2008 | Lui et al. | 327/513 |
| 7,687,396 B2 * | 3/2010 | Vitale et al. | 438/664 |
| 7,759,190 B2 * | 7/2010 | Shih et al. | 438/245 |
| 8,120,135 B2 * | 2/2012 | Krischke et al. | 257/467 |

(Continued)

*Primary Examiner* — Steven W Smoot
*Assistant Examiner* — Edward Chin
(74) *Attorney, Agent, or Firm* — Kevin B. Jackson

(57) ABSTRACT

In one embodiment, a semiconductor device includes an isolated trench-electrode structure. The semiconductor device is formed using a modified photolithographic process to produce alternating regions of thick and thin dielectric layers that separate the trench electrode from regions of the semiconductor device. The thin dielectric layers can be configured to control the formation channel regions, and the thick dielectric layers can be configured to reduce switching losses.

21 Claims, 19 Drawing Sheets

(56) References Cited

U.S. PATENT DOCUMENTS

| | | | |
|---|---|---|---|
| 8,222,693 B2* | 7/2012 | Koops et al. | 257/335 |
| 2003/0209757 A1* | 11/2003 | Henninger et al. | 257/329 |
| 2006/0131636 A1* | 6/2006 | Jeon et al. | 257/315 |
| 2008/0064194 A1* | 3/2008 | Hong | 438/589 |
| 2008/0150021 A1* | 6/2008 | Koops et al. | 257/331 |
| 2009/0057740 A1* | 3/2009 | Jang | 257/301 |
| 2009/0072406 A1* | 3/2009 | Yang et al. | 257/761 |
| 2009/0098740 A1* | 4/2009 | Kim et al. | 438/782 |
| 2009/0289297 A1* | 11/2009 | Kim et al. | 257/324 |
| 2009/0302401 A1* | 12/2009 | Teo et al. | 257/410 |
| 2010/0193898 A1* | 8/2010 | Hautala et al. | 257/506 |
| 2010/0291771 A1* | 11/2010 | Zhou et al. | 438/710 |
| 2011/0230042 A1* | 9/2011 | Chew et al. | 438/591 |
| 2011/0256704 A1* | 10/2011 | Xu et al. | 438/590 |
| 2012/0012924 A1* | 1/2012 | Meiser et al. | 257/330 |
| 2012/0193620 A1* | 8/2012 | Godo et al. | 257/43 |
| 2013/0307062 A1* | 11/2013 | Meiser et al. | 257/330 |

* cited by examiner

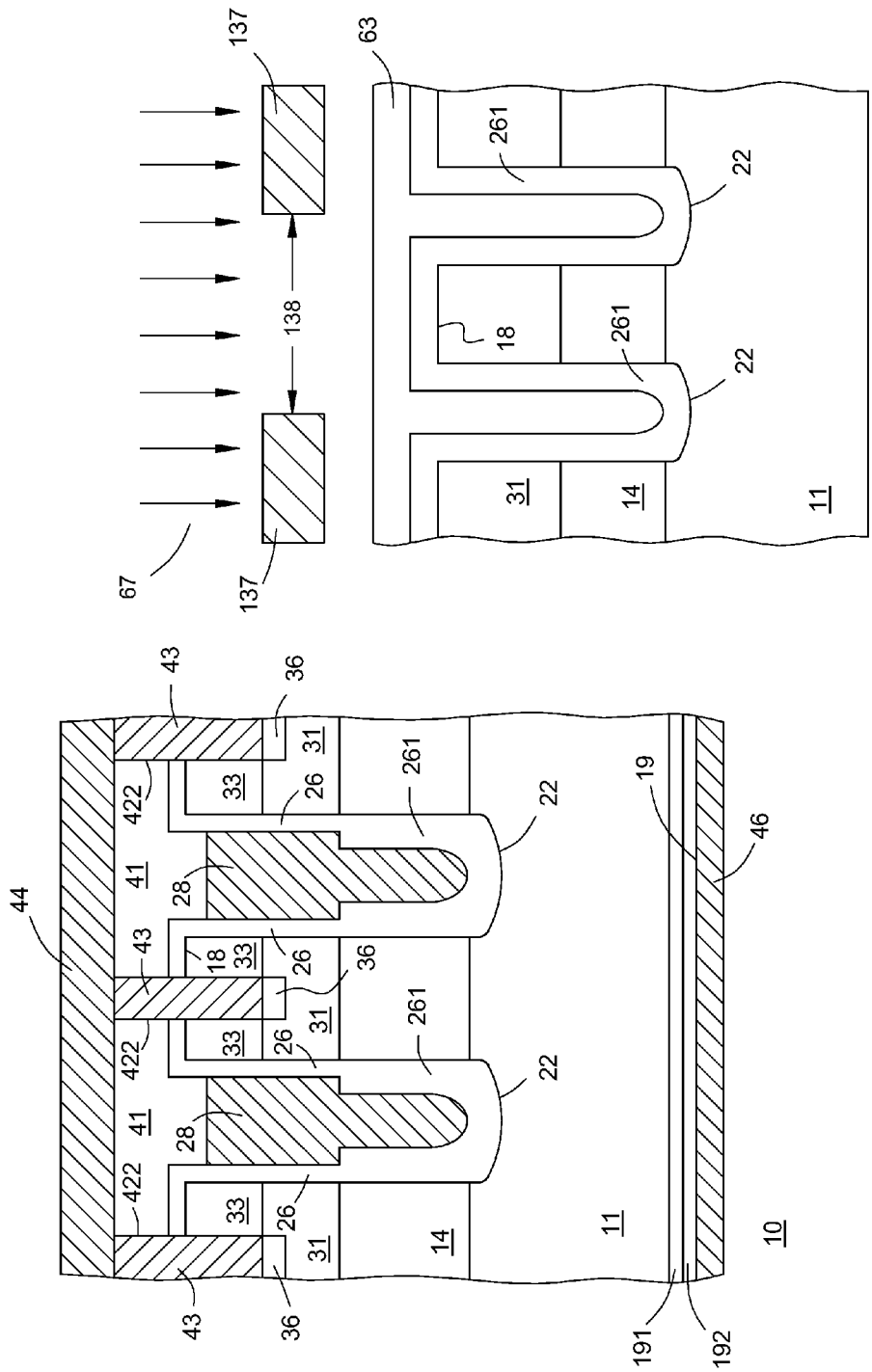

METHOD OF FORMING A SEMICONDUCTOR DEVICE HAVING A PATTERNED GATE DIELECTRIC AND STRUCTURE THEREFOR

BACKGROUND OF THE INVENTION

This document relates generally to semiconductor devices and, more specifically, to methods of forming insulated gate devices and structures.

Insulated gate field effect semiconductor transistor (IGFET) devices have been used in many power conversion and switching applications, such as dc-dc converters, electric vehicles, variable speed refrigerators, air-conditioners, and other white goods. IGFET devices include metal oxide FETs (MOSFETs), insulated gate bipolar transistors (IGBTs), and MOS gated thyristors. In a typical IGFET, a gate electrode provides turn-on and turn-off control with the application of an appropriate gate voltage.

There is a class of IGFET devices in which the gate electrodes have been formed in trenches that extend away from a major surface of a semiconductor material, such as silicon. Current flow in this class of trench-gated devices is primarily in a vertical direction through the device, and, as a result, device cells can be more densely packed. All else being equal, the more densely packed device cells can increase the current carrying capability and reduce on-resistance of the device.

One disadvantage of trench-gated IGFET devices is that capacitances associated with the gate electrode have led to switching losses, which manufacturers have attempted to reduce. Such attempts have included structures that have used thickened dielectric structures where the gate electrode adjoins, for example, the drift region. However, such attempts have used spacer processes and multiple trench etch steps to form the thicker dielectric structures, which have increased manufacturing costs. Also, such attempts have not been flexible and have not supported multiple topographies or dielectric configurations within a single device.

Accordingly, it is desirable to have a method and structure that reduce gate capacitances in trench-gated semiconductor devices. Also, it is desirable for the method and structure to be integrated easily into existing process flows and to be supportive of multiple gate structure configurations within a single device.

BRIEF DESCRIPTION OF THE DRAWINGS

FIGS. 1-9 illustrate partial cross-sectional views of a semiconductor device at various stages of fabrication in accordance with a first embodiment of the present invention;

FIGS. 10-14 illustrate partial cross-sectional views of a semiconductor device at various stages of fabrication in accordance with a second embodiment of the present invention;

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein, current-carrying electrode means an element of a device that carries current through the device, such as a source or a drain of an MOS transistor, an emitter or a collector of an IGBT or bipolar transistor, or a cathode or anode of a diode. Also, a control electrode means an element of the device that controls current through the device, such as a gate of a MOS transistor or an IGBT or a base of a bipolar transistor. Although the devices are explained herein as certain N-channel devices, a person of ordinary skill in the art understands that P-channel devices and complementary devices are also possible in accordance with the present description. For clarity of the drawings, regions (for example, doped regions) within the device structures may be illustrated as having generally straight-line edges and precise angular corners; however, those skilled in the art understand that due to processing effects, the edges of regions are generally not straight lines and the corners are not precise angles.

Furthermore, the term "major surface" when used in conjunction with a semiconductor region or substrate means the surface of the semiconductor region or substrate that forms an interface with another material, such as a dielectric, an insulator, a conductor, or a polycrystalline semiconductor. The major surface can have a topography that changes in the x, y and z directions.

In addition, structures of the present description can embody either a cellular-base design (in which the body regions are a plurality of distinct and separate cellular or stripe regions) or a single-base design (in which the body region is a single region formed in an elongated pattern, typically in a serpentine pattern or a central portion with connected appendages). However, one embodiment of the present description will be described as a single-base design throughout the description for ease of understanding. It should be understood that the present disclosure encompasses both a cellular-base design and a single-base design.

DETAILED DESCRIPTION OF THE DRAWINGS

Figure 1:
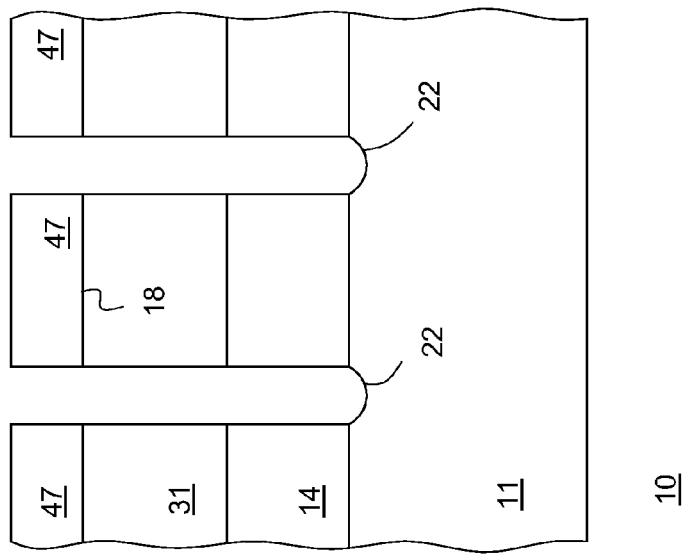

FIG. 1 illustrates a partial cross-sectional view of a semiconductor device 10 or cell 10 at an early stage of fabrication in accordance with a first embodiment.

In the first embodiment, device 10 is described in an IGBT embodiment, but it is understood that the present description is also applicable to other IGFET devices. Device 10 includes a region of semiconductor material, semiconductor substrate, or semiconductor region 11, which can be, for example, an n-type silicon substrate having a resistivity of about 10 ohm-cm to about 200 ohm-cm. By way of example, substrate 11 can be doped with phosphorous, arsenic, or antimony. In one embodiment, substrate 11 can be formed using float-zone (FZ) techniques. In another embodiment, substrate 11 can be formed using Czochralsky (CZ) techniques or epitaxial growth techniques.

In one embodiment, device 10 can further include an n-type doped region or JFET region 14 formed in a portion of substrate 11. In one embodiment, JFET region 14 can be formed using ion implantation. By way of example, a phosphorous ion implant can be used with an ion implant dose from about $1.0 \times 10^{12}$ atoms/cm$^2$ to about $3.0 \times 10^{13}$ atoms/cm$^2$ and with an ion implant energy of about 100 keV. In one embodiment, an implant screen oxide layer can be used. In one embodiment, device 10 can be heated to redistribute and activate the implanted dopant. In one embodiment, JFET region 14 can have depth of about 4 microns to about 8 microns.

Device 10 can further include a p-type doped region, p-type base region, or p-type well region 31 formed adjacent to major surface 18. In the present embodiment, region 31 is between JFET region 14 and major surface 18. Region 31 can be formed using ion implantation. By way of example, a boron ion implant can be used with an ion implant dose from about $2.0 \times 10^{13}$ atoms/cm$^2$ to about $4.0 \times 10^{14}$ atoms/cm$^2$ and with an ion implant energy of about 100 keV. In one embodiment, device 10 can be heated to redistribute and activate the implanted dopant. In one embodiment, region 31 can have a depth of about 2 microns to about 6 microns.

In one embodiment, a masking layer 47 can be formed overlying major surface 18. In one embodiment, masking layer 47 can be a dielectric layer or layers. In one embodiment, masking layer 47 can be an oxide formed using a thermal oxidation process and can have a thickness of about 0.2 microns to about 0.5 microns. Next, openings 58 can be formed in masking layer 47, which can extend partially into masking layer 47 or all the way through to expose segments of major surface 18. In one embodiment, openings 58 can be formed using photolithographic and etch techniques.

Figure 2:
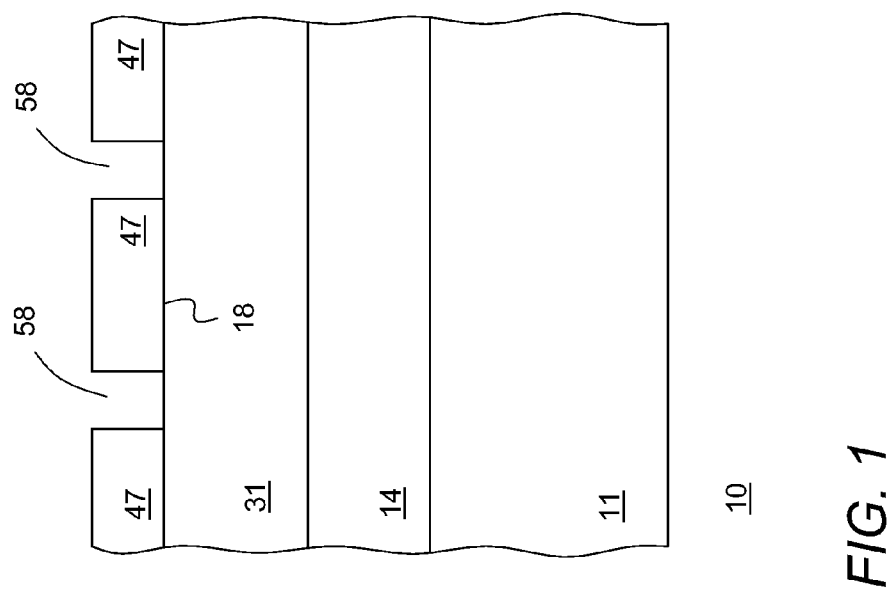
Figure 3:
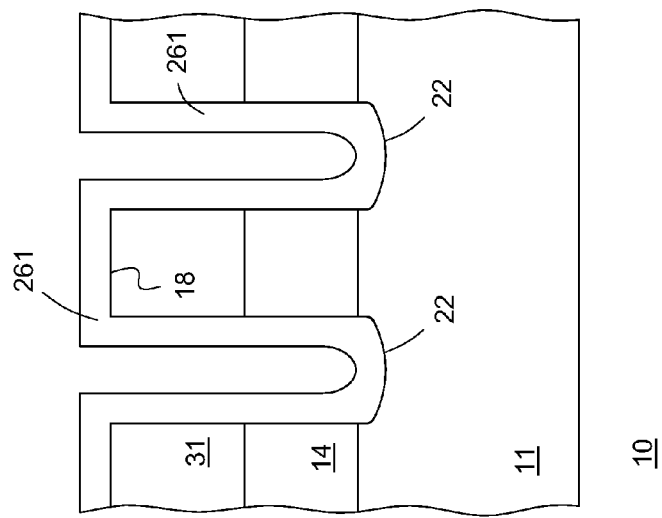

FIG. 2 illustrates a partial cross-sectional view of device 10 after additional processing. In one embodiment, segments of substrate 11 can be removed to form trenches 22 extending from major surface 18. By way of example, trenches 22 can be etched using plasma etching techniques with a hydrogen bromide chemistry (for example, HBr/HeO$_2$/NF$_3$), a fluorocarbon chemistry, or a fluorinated chemistry (for example, SF$_6$/O$_2$). In one embodiment, trenches 22 can have a depth of about 4 microns to about 9 microns. In an optional step, a sacrificial layer (not shown) can be formed adjoining surfaces of trenches 22. By way of example, a thermal silicon oxide layer can be formed. Next, the sacrificial layer and dielectric layer 47 can be removed using, for example, an etch process. The foregoing process can be repeated. A layer 261 of material can then be formed along surfaces of trenches 22 and along major surface 18 as illustrated in FIG. 3. In one embodiment, layer 261 can be a deposited or grown dielectric or insulative material. By way of example, layer 261 can be about a 0.3 micron thermal oxide layer. Portions of substrate 11 can be consumed during the formation of layer 261.

Figure 4:
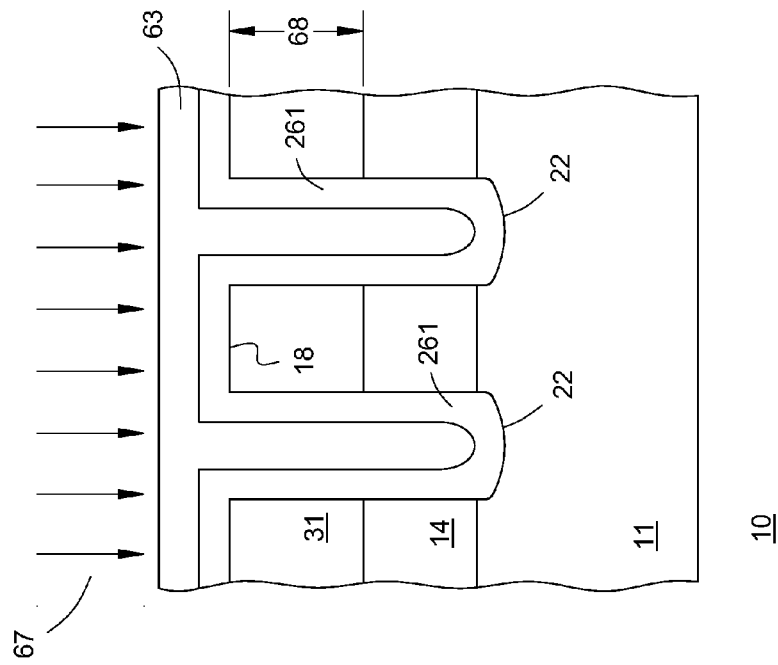

FIG. 4 illustrates a partial cross-sectional view of device 10 after further processing. In one embodiment, a layer 63 is formed along surfaces of layer 261 within trenches 22. In one embodiment, layer 63 can extend along surfaces of layer 261 overlying major surface 18 as illustrated in FIG. 4. In one embodiment, layer 63 can be a photosensitive layer or material. In one embodiment, layer 63 can be a photoresist material, such as positive photoresist. In one embodiment, layer 63 can be a Shipley brand photoresist, such as an 1813 positive photoresist. In one embodiment, substrate 11 can be pre-baked in an HMDS environment before layer 63 is coated onto substrate 11 to improve the adhesion of layer 63. In one embodiment suitable for filling trenches 22, a first portion of layer 63 can be deposited at a coater spin rate of about 5000 rpm to about 5500 rpm, and a second portion of layer 63 can be deposited at a coater spin rate of about 450 rpm to about 600 rpm with the spin rate increased to about 2500 rpm to about 3000 rpm thereafter to further spread the photoresist layer. Layer 63 can then be hard-baked after the coating step.

In one embodiment, layer 63 can be then exposed to an energy source, such as a photon or electron energy source, which can change the chemical and/or physical characteristics of layer 63 so that it becomes soluble, for example, in a developer solution. In one embodiment, layer 63 can be exposed to a ultra-violet (UV) light source as generally illustrated by arrows 67 in FIG. 4. In accordance with the present embodiment, layer 63 can be exposed to UV light source (i-line) at a dose from about 100 milli-Joules/cm$^2$ (mJ/cm$^2$) to about 1000 mJ/cm$^2$ or to exposure times from about 100 milli-seconds to about 2000 milli-seconds. Also, in accordance with the present embodiment, a higher dose or a longer period of time at a lower does exposes layer 63 to a greater depth within trenches 22. By way of example, when the exposure energy is about 200 mJ/cm$^2$, layer 63 is exposed to a depth (generally illustrated as depth 68) of about 2.9 microns from major surface 18 when trenches 22 have a width of about 1.5 microns. When the exposure energy is about 300 mJ/cm$^2$, depth 68 is about 3.7 microns. When the exposure energy is about 400 mJ/cm$^2$, depth 68 is about 4.4 microns.

Figure 5:
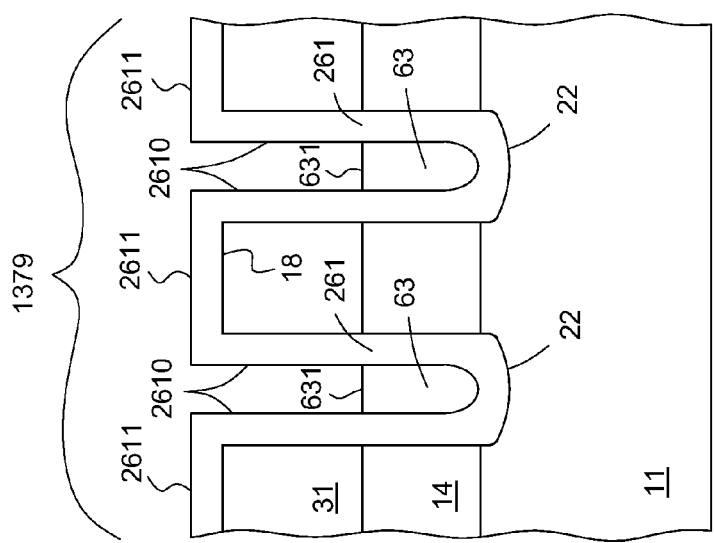

After layer 63 is exposed, the exposed portions of layer 63 can be removed as illustrated in FIG. 5, which leaves portions or unexposed portions 631 of layer 63 remaining along lower surfaces of trenches 22. In one embodiment, a developer solution, such as a tetra-methyl ammonium hydroxide (TMAH) developer, can be used. In accordance with the present embodiment, the development process can be adjusted to better ensure exposed portions of layer 63 are developed and removed from deeper portions of trenches 22. In one embodiment, the developer can be deposited onto substrate 11 while substrate 11 is spinning at spin rate of about 400 rpm for about 3 seconds to about 4 seconds. The spin rate can then be reduced in steps to about 30 rpm to 15 rpm before turning off the developer. The developer can then be left in place on substrate 11 for about 25 seconds to about 40 seconds at a spin rate of about 10 rpm to about 20 rpm. Substrate 11 can then be exposed to additional developer for about 2 seconds to 5 seconds at a spin rate of about 20 rpm to about 400 rpm. The developer can again be left in place on substrate 11 for about 20 seconds to about 40 seconds at a spin rate of about 10 rpm to about 20 rpm before rinsing substrate 11 in de-ionized water for about 20 seconds to about 40 seconds at a spin rate between about 150 rpm and about 1000 rpm. The removal step of layer 63 can leave upper portions or portions 2610 of layer 261 within trenches 22 and portions 2611 of layer 261 overlying major surface 18 exposed through an opening 1379 for subsequent processing.

Figure 6:
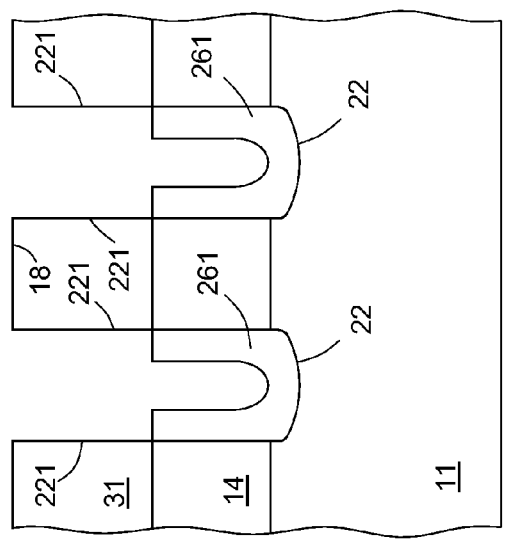

FIG. 6 illustrates a partial cross-sectional view of device 10 after additional processing. Portions 2610 can be removed or reduced in thickness. In one embodiment, a wet and/or dry isotropic etch process can be used to remove at least a part of portions 2610. In one embodiment, about 0.02 microns or more of portions 2610 can remain after a dry isotropic etch step. In one embodiment, portions 631 of layer 63 can then be removed by using either a dry/wet removal process or a wet removal process. In one embodiment, a buffered oxide etch (for example, a 10:1 hydrofluoric acid etch) can be used to strip and/or clean exposed or upper sidewall portions 221 of trenches 22.

Figure 7:
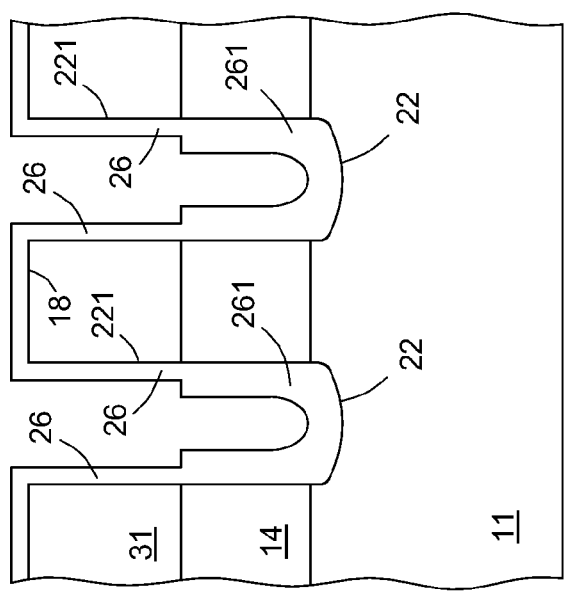

FIG. 7 illustrates a partial cross-sectional view of device 10 after further processing. In one embodiment, upper sidewall portions 221 and major surface 18 can be cleaned using, for example, an SC1/SC2 cleaning process. A layer 26 of material can then be formed along exposed surfaces of trenches 22 and along major surface 18. In one embodiment, layer 26 can be a grown or deposited dielectric or insulative material. Layer 26 can be oxides, nitrides, tantalum pentoxide, titanium dioxide, barium strontium titanate, high k dielectric materials, combinations thereof, or other related or equivalent materials as known by one of ordinary skill in the art. By way of example, layer 26 can be about 0.01 microns to about 0.2 microns of thermal oxide. In one embodiment, layer 26 can be formed using dry oxidation process techniques. In accordance with the present embodiment, layer 26 is thinner than layer 261.

Figure 8:
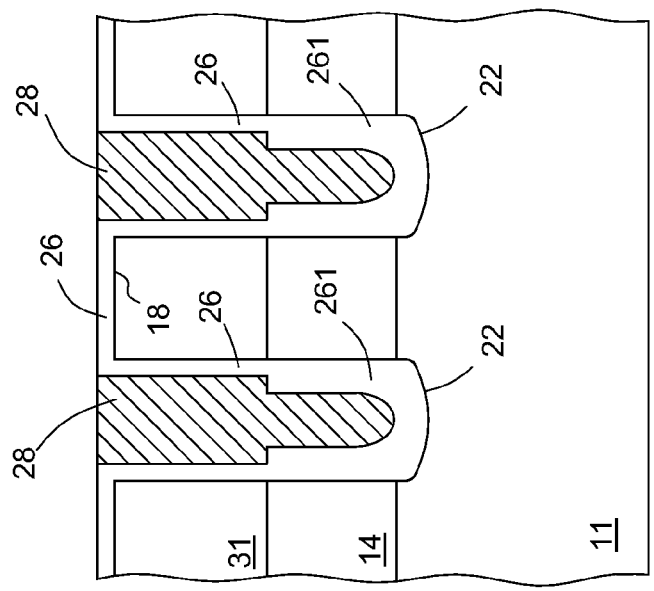

FIG. 8 illustrates a partial cross-sectional view of device 10 after further processing. A layer of material can be formed overlying major surface 18 and within trenches 22 along layers 26 and 261. In one embodiment, the layer of material can be a crystalline semiconductor material, a conductive material, or combinations thereof. In one embodiment, the layer of material can be doped polysilicon. In one embodiment, the polysilicon can be doped with an n-type dopant, such as phosphorous or arsenic. Subsequently, the layer of material can be planarized using layer 26 as a stop layer. In one embodiment, an etch-back step can be used for the planarization step. In another embodiment, chemical mechanical planarization can be used for the planarization step. The planarization step can be used to form gate electrodes 28 within trenches 22 as illustrated in FIG. 8.

FIG. 9 illustrates a partial cross-sectional view of device 10 after additional processing. In a subsequent step, a masking layer (not shown) can be formed overlying portions of major surface 18. In one embodiment, emitter regions, current conducting regions, or current carrying regions 33 can be formed within, in, or overlying regions 31. In one embodiment, regions 33 can have n-type conductivity and can be formed using, for example, a phosphorous or arsenic dopant source. In one embodiment, an ion implant doping process can be used to form source regions 33 within body regions 31. The masking layer can then be removed, and the implanted dopant can be annealed.

In one embodiment, gate electrodes 28 can be recessed below major surface 18 as illustrated in FIG. 9. In one embodiment, about 0.15 microns to about 0.25 microns of material can be removed as a result of the recessing step. In one embodiment, a layer or layers 41 can be formed overlying major surface 18. In one embodiment, layers 41 comprise dielectric or insulative layers and can be configured as an inter-layer dielectric (ILD) structure. In one embodiment, layers 41 can be silicon oxides, such as doped or undoped deposited silicon oxides. In one embodiment, layers 41 can include at least one layer of deposited silicon oxide doped with phosphorous or boron and phosphorous and at least one layer of undoped oxide. In one embodiment, layers 41 can have a thickness from about 0.4 microns to about 1.0 microns. In one embodiment, layers 41 can be planarized to provide a more uniform surface topography, which improves manufacturability.

Subsequently, a masking layer (not shown) can be formed overlying device 10, and openings, vias, or contact trenches 422 can be formed for making contact to regions 33 and 31. In one embodiment, the masking layer can be removed, and a recess etch can be used to remove portions of regions 33. The recess etch step can expose portions of regions 31 below regions 33. A p-type body contact, enhancement region, or contact region 36 can then be formed in regions 31, which can be configured to provide a lower contact resistance to regions 31. Ion implantation (for example, using boron) and anneal techniques can be used to form contact regions 36.

In one embodiment, conductive regions 43 can then be formed in contact trenches 422 and configured to provide for electrical contact to regions 33 and regions 31 through contact regions 36. In one embodiment, conductive regions 43 can be conductive plugs or plug structures. In one embodiment, conductive regions 43 can include a conductive barrier structure or liner and a conductive fill material. In one embodiment, the barrier structure can include a metal/metal-nitride configuration, such as titanium/titanium-nitride or other related or equivalent materials as known by one of ordinary skill in the art. In another embodiment, the barrier structure can further include a metal-silicide structure. In one embodiment, the conductive fill material includes tungsten. In one embodiment, conductive regions 43 can be planarized to provide a more uniform surface topography.

A conductive layer 44 can be formed overlying major surface 18. Conductive layer 44 can be configured to provide electrical connection between the individual device components of device 10 and a next level of assembly. In one embodiment, conductive layer 44 can be titanium/titanium-nitride/aluminum-copper or other related or equivalent materials as known by one of ordinary skill in the art, and is configured in the present embodiment as an emitter electrode or terminal. In another embodiment, conductive regions 43 are not used, and conductive layer 44 can be used to contact regions 31, 33, and 36.

In one embodiment, portions of major surface 19 of substrate 11 opposite to major surface 18 can be removed using, for example, a backgrind process. An optional n-type doped region or buffer layer 191 can be formed in substrate 11 extending from major surface 19, and a p-type doped region or injecting layer 192 can be formed adjoining major surface 19. In one embodiment, doped region 191 is formed with high energy ion implantation, and 192 can be formed with low energy ion implantation. Next, a conductive layer 46 can be formed overlying major surface 19 as illustrated in FIG. 9. Conductive layer 46 can be a solderable metal structure, such as aluminum-titanium-nickel-silver or other related or equivalent materials known by one of ordinary skill in the art, and is configured in the present embodiment as a collector electrode or terminal. In one embodiment, a further passivation layer (not shown) can be formed overlying conductive layer 44.

In one embodiment, the operation of device 10 can proceed as follows. For purposes of this description, the junction between emitter region 33 and base region 31 is designated as J1; the junction between base region 31 and JFET region 14 is designated as J2; and the junction between injecting layer 192 and layer 191/substrate (drift region) 11 is designated as J3. Assume that a positive voltage is applied across emitter electrode 44 and collector electrode 46 with gate electrode 28 shorted to emitter electrode 44. Under these bias conditions, device 10 enters into a forward-blocking state with junctions J1 and J3 forward-biased and junction J2 reverse-biased. A depletion layer can extend on both sides of junction J2 partly into base region 31 and JFET region 14. Device 10 can be switched from the forward-blocking state to a forward-conducting state by removing the short between the gate and emitter electrodes and by applying a positive gate voltage of sufficient level to invert that portion of base region 31 adjacent layer 26 and gate electrode 28 to form a conduction channel. In the forward-conducting state, the channel connects emitter regions 33 to JFET region 14/substrate 11, and majority carrier electrons can be transported from emitter regions 33 to substrate 11. The transport of electrons into substrate 11 lowers the potential of substrate 11, which results in junction J3 becoming forward biased. Under forward-bias, junction J3 injects minority carrier holes into substrate 11, which further attracts electrons from emitter regions 33 to enhance the conductivity of substrate 11 while device 10 is in the forward-conducting state.

Several factors can affect the switching characteristics of device 10. Included in those factors is the capacitance between gate electrode 28 and JFET region 14/substrate 11. In accordance with the present embodiment, layer 261 is configured to have a greater thickness than layer 26, which reduces this capacitance thereby improving the switching characteristics of device 10. In one embodiment, device 10 was found to reduce the gate capacitance by more than 20% compared to a related trench-gated device having a uniform and thin dielectric layer lining all surfaces of the trench. One benefit of the described gate electrode and dielectric configuration is that smaller gate driver devices can be used in applications, such as hybrid integrated circuit modules. This allows for smaller packages and reduced costs. Additionally, the method in accordance with the present embodiment was found to improve the gate oxide integrity (GOI) of device 10 compared to related trench-gated devices, which further enhances the reliability of device 10 particularly in applications requiring more robust devices, such as automotive, medical, or military applications.

FIG. 10 illustrates a partial cross-sectional view of a device 20 in accordance with another embodiment. Device 20 can be prepared in a similar manner as described and illustrated in FIGS. 1-4 with device 10, except that in this embodiment, a masking layer 137 can be formed overlying layer 63. In one embodiment, masking layer 137 can be patterned to include an opening 138, which is configured in one embodiment to allow a portion of UV light (represented by arrows 67) to expose a reduced amount of layer 63 compared to device 10. In one embodiment, layer 63 can be exposed in accordance with the conditions described in conjunction with FIG. 4. Subsequently, exposed portions of 63 can be removed using, for example, a development process, such as the process described in conjunction with FIG. 5, to provide the structure illustrated in FIG. 11. As illustrated, in device 20 layer 261 has only one side portion 2610 exposed within trenches 22. In one embodiment, portions 2610 of layer 261 within trenches 22 and a portion 2611 of layer 261 along major surface 18 are exposed through opening 1380.

In one embodiment, a wet and/or dry isotropic etch process can be used to remove at least a portion of portions 2610. In one embodiment, about 0.02 microns or more of portions 2610 can remain after a dry isotropic etch step. In one embodiment, remaining portions of layer 63 can then be removed by using either a dry/wet removal process or a wet removal process. In one embodiment, a buffered oxide etch (for example, a 10:1 hydrofluoric acid etch) can be used to strip and/or clean exposed or upper sidewall portions 221 of trenches 22 and a portion of major surface 18.

Figure 12:
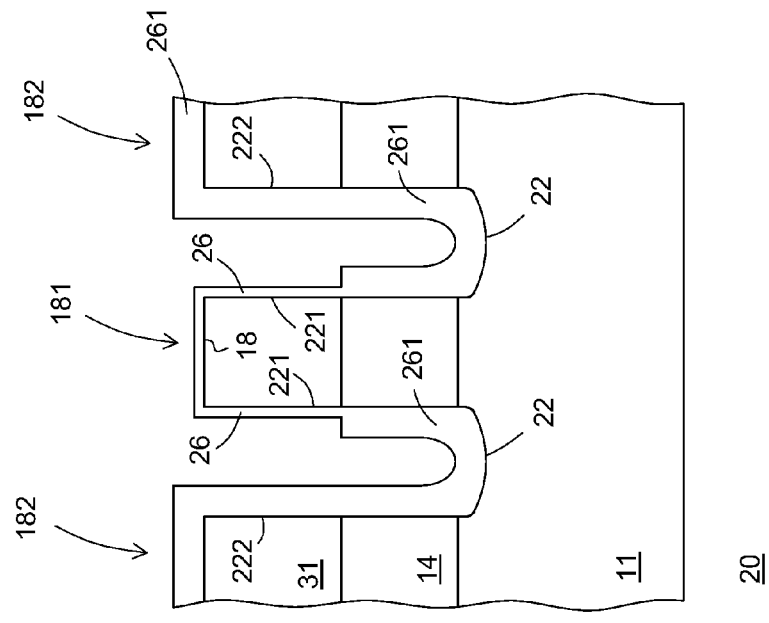
Figure 14:
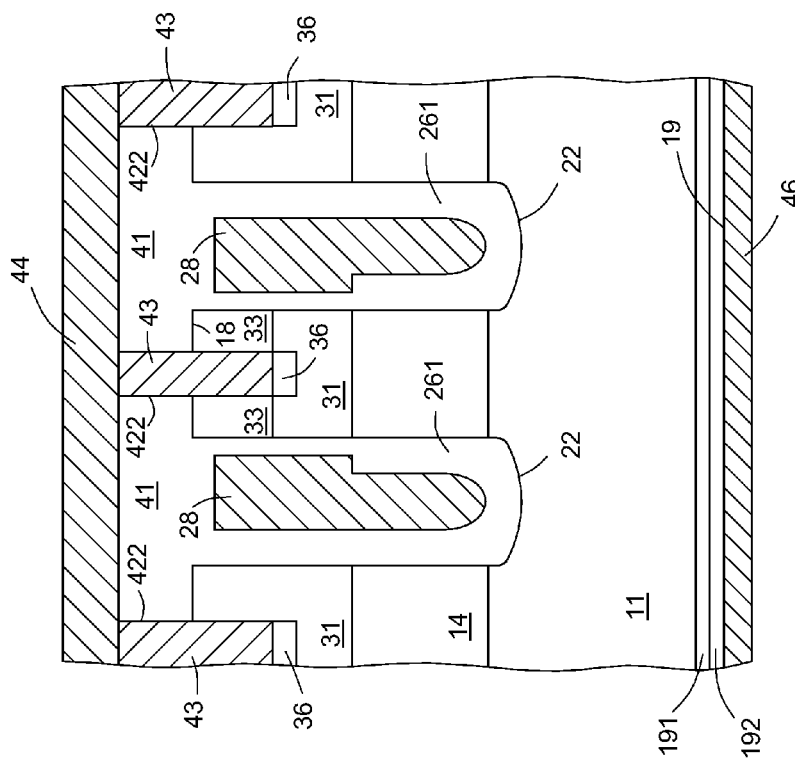
Figure 13:
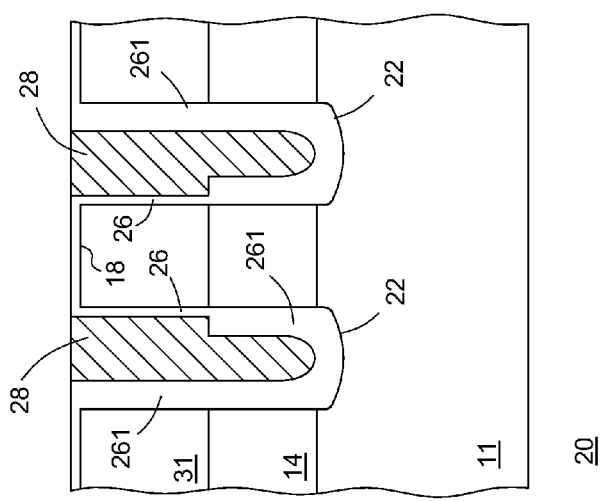

In one embodiment, upper sidewall portions 221 of trenches 22 and portions of major surface 18 can be cleaned using, for example, an SC1/SC2 cleaning process. Similar to device 10, layer 26 of material can then be formed along exposed surfaces of trenches 22 (for example, sidewall portions 221) and along major surface 18 (for example, portion 181) as illustrated in FIG. 12. In one embodiment, device 20 has a portion of dielectric layer 261 remaining along sidewall portions 222 opposite to sidewall portions 221. In one embodiment, layer 26 can be a grown or deposited dielectric or insulative material. By way of example, layer 26 can be about 0.01 microns to about 0.2 microns of thermal oxide. In one embodiment, layer 26 can be formed using dry oxidation process techniques. In accordance with the present embodiment, layer 26 is thinner than layer 261. In one embodiment, device 20 has alternating portions of dielectric layer 261 and dielectric layer 26 overlying different portions of major surface 18 as represented by portions 181 and 182. In subsequent steps, device 20 can be processed in accordance with the process steps described for device 10 in conjunction with FIGS. 8 and 9 to provide the structures illustrated in FIGS. 13 and 14. As illustrated with device 20 and in accordance with the present embodiment, the method described can be flexible to provide a variety of thin/thick gate structures or three-dimensional gate dielectric structures, which is not achievable with related spacer process techniques.

Figure 15:
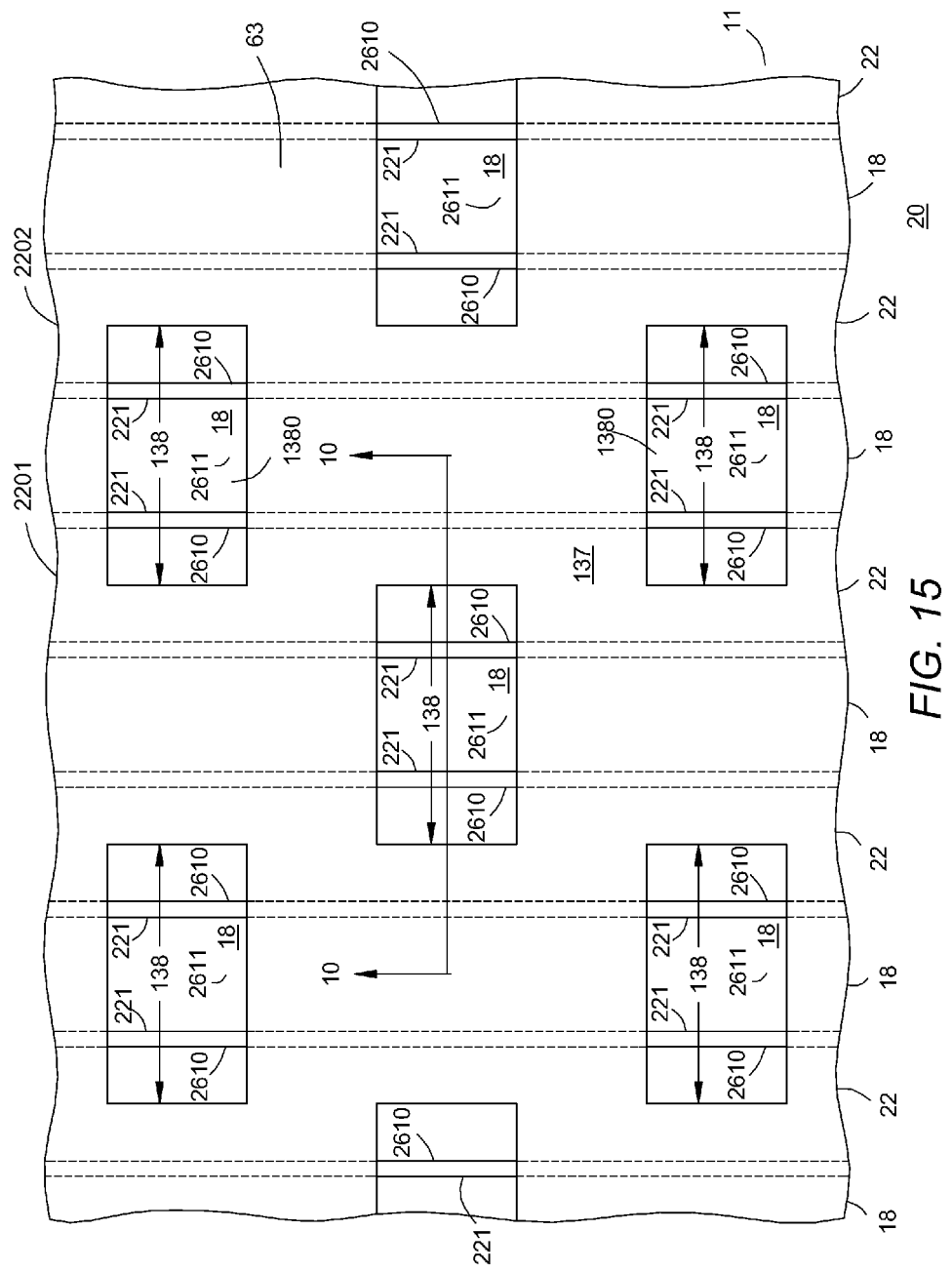
FIG. 15 illustrates a partial top view of a portion of a semiconductor device including the device of FIG. 10.

FIG. 15 illustrates a top view of device 20 at an intermediate step. By way of example, the partial cross-sectional view of device 20 in FIG. 10 is taken along reference line 10-10. As illustrated, masking layer 137 overlies layer 63, which is formed along major surface 18 and within trenches 22. In one embodiment, masking layer 137 has openings 138, which allow for light to pass through masking layer 137 to expose portions of layer 63 during an exposure step. In one embodiment, those portions of masking layer 137 can be opaque, which is illustrated in FIG. 15 by the dashed lines representing the various features on substrate 11. In one embodiment, the opaque portions of masking layer 137 represent those portions of layer 63 that are not exposed during an exposure step. In one embodiment, masking layer 137 can be used in the method described herein to form a plurality of openings (for example, openings 1380) that are spaced apart along upper sidewall surfaces of adjacent trenches 22 (for example, trenches 2201 and 2202). At least one opening (for example, one of openings 1380) exposes adjoining portions of upper sidewall 221 of trench 2201, major surface 18, and upper sidewall surface 221 of trench 2202. In one embodiment, masking layer 137 can be formed in a staggered configuration so that opposite and/or adjacent sidewalls 221 and 222 of trenches 22 can have alternating portions of thin and thick gate dielectric layers. In one embodiment, those portions of device 20 generally underneath the opaque portions of masking layer 137 have thicker dielectric layers 261 in the final device, and those portions of device 20 underneath openings 138 have thinner dielectric layers 26 along upper sidewall surfaces 221 of trenches 22 in the final device. In one embodiment, portions of major surface 18 adjacent trenches 22 can be formed having alternating portions of thick (for example, portions 182 illustrated in FIG. 12) and thin (for example, portions 181 illustrated in FIG. 12) dielectric layer thereon.

Figure 11:
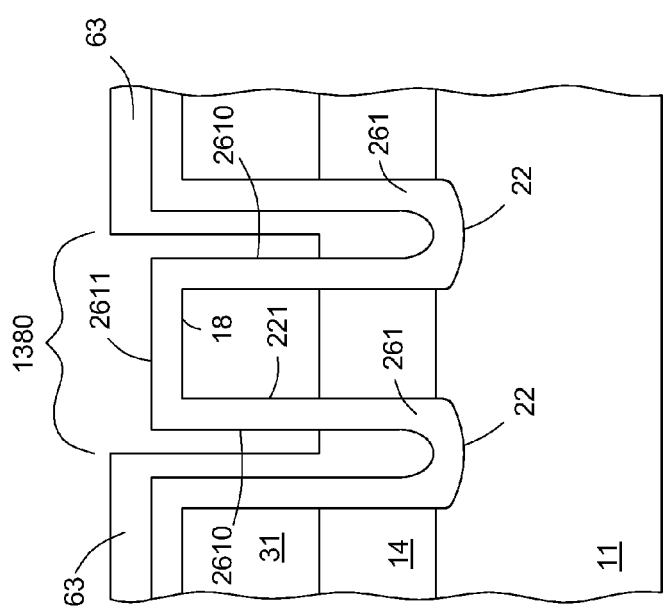
Figure 16:
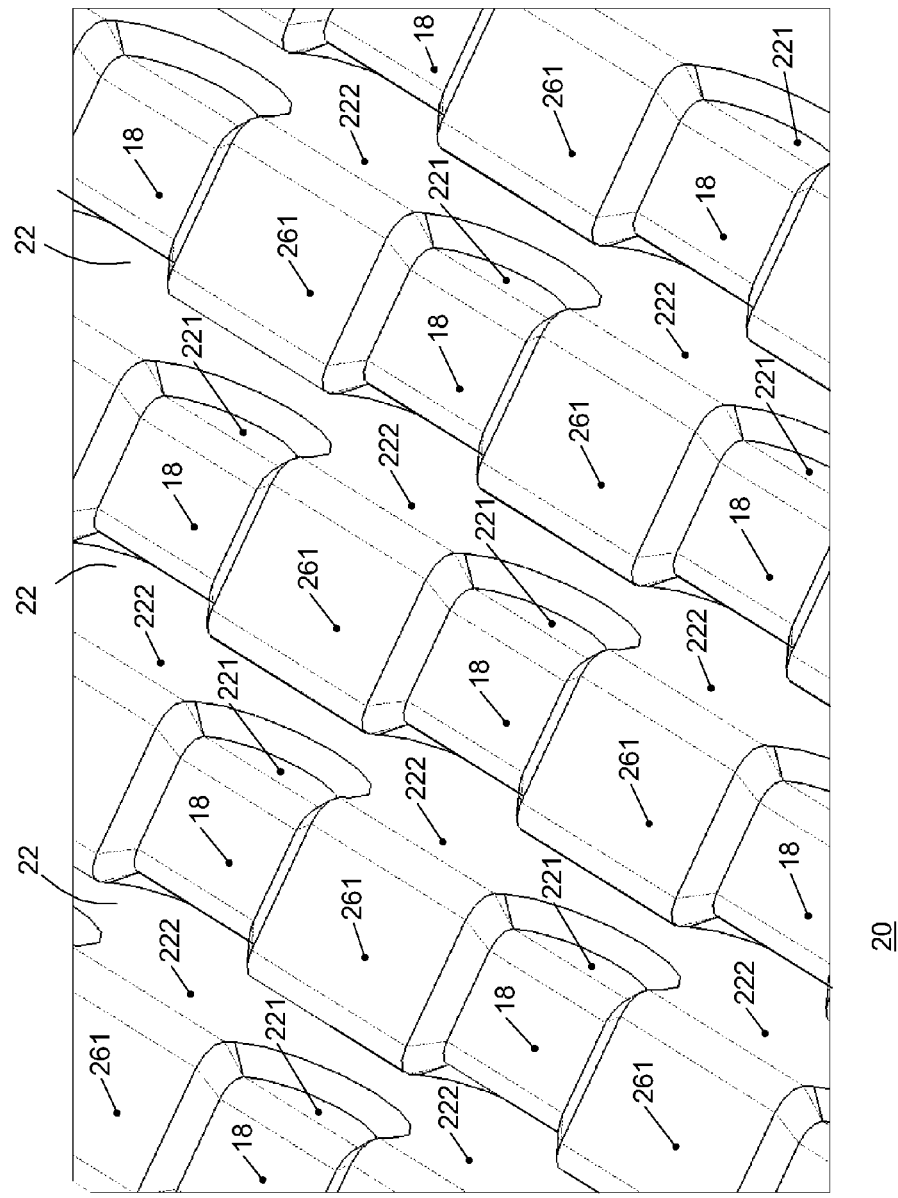
FIG. 16 illustrates a plan view of a portion of the semiconductor device illustrated in FIG. 12.

FIG. 16 illustrates a partial plan view of device 20 at a step between those illustrated in FIGS. 11 and 12. Specifically, device 20 is illustrated after portions 2610 and 2611 of dielectric layer 261 have been removed or reduced in thickness, and before layer 26 is formed. As illustrated in FIG. 16, device 20 includes alternating portions where sidewall portions 221 can be exposed and other parts where sidewall portions 221 can be covered by dielectric layer 261. In one embodiment, dielectric layer 261 is reduced in thickness through the openings (for example, openings 1380) while leaving other portions of dielectric layer 261 in place along other surfaces of the trench adjacent the openings. In one embodiment, layer 26 can be formed in subsequent processing steps along those segments of major surface 18 and sidewall portions 221 where dielectric layer 261 has been removed or reduced in thickness.

Figure 17:
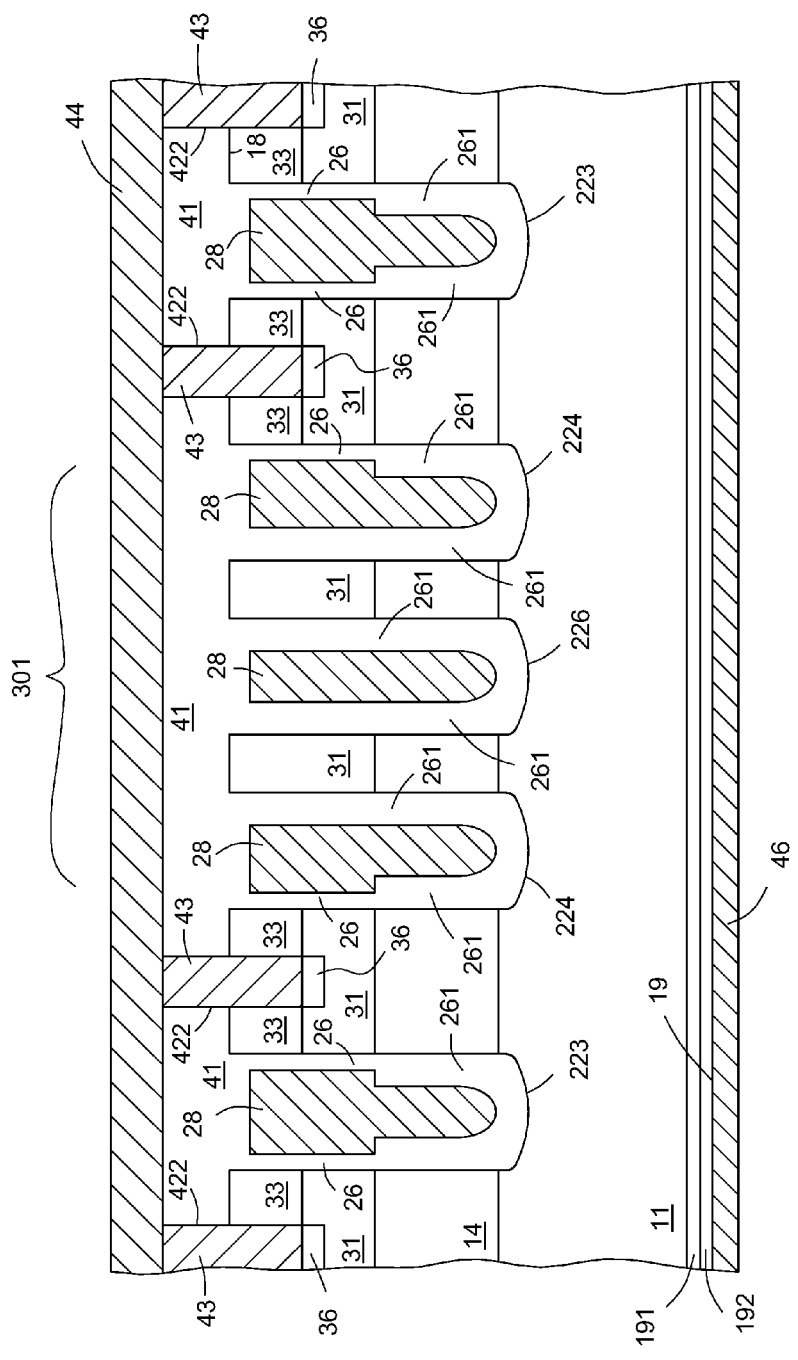
FIG. 17 illustrates a partial cross-sectional view of a portion of a semiconductor device in accordance with an additional embodiment of the present invention.

FIG. 17 illustrates a partial cross-sectional view of a device 30 in accordance with a further embodiment at a later stage of fabrication. Device 30 illustrates an embodiment formed using the method described herein. In one embodiment, device 30 is formed having trench gate structures 223 with layers 26 on opposing sides of gate electrodes 28, having trench gate structures 224 with layers 26 on one side only of gate electrodes 28, and having trench electrode structure 226 with layer 261 along all surfaces of gate electrode 28. In one embodiment, device 30 is configured as an enhanced injection IGBT. Device 30 can include a floating cell portion 301, which is formed without a contact 43. This configuration can result in an increased hole concentration near active cells and, subsequently, in higher electron injection and lower $VCE_{ON}$ while maintaining good short circuit robustness. Trench 226 in the center of floating cell portion 301 can reduce the total amount of charge necessary to deplete from region 31 in between trench gate structures 224 (the floating part of 31, that is 311 in FIG. 19) during turnoff. In an alternate embodiment, trench gate structure 224 and trench electrode structure 226 can be replaced with trench gate structure 223. In another alternate embodiment, trench electrode structure 226 can be connected to emitter electrode 44 instead of to gate electrode 28 in order to reduce gate capacitance. In yet another embodiment, gate electrode structures 223 can be omitted from device 30 in which case current in the ON state would flow only through channels formed along trench gate structures 224 in order to further improve short circuit robustness.

Figure 18:
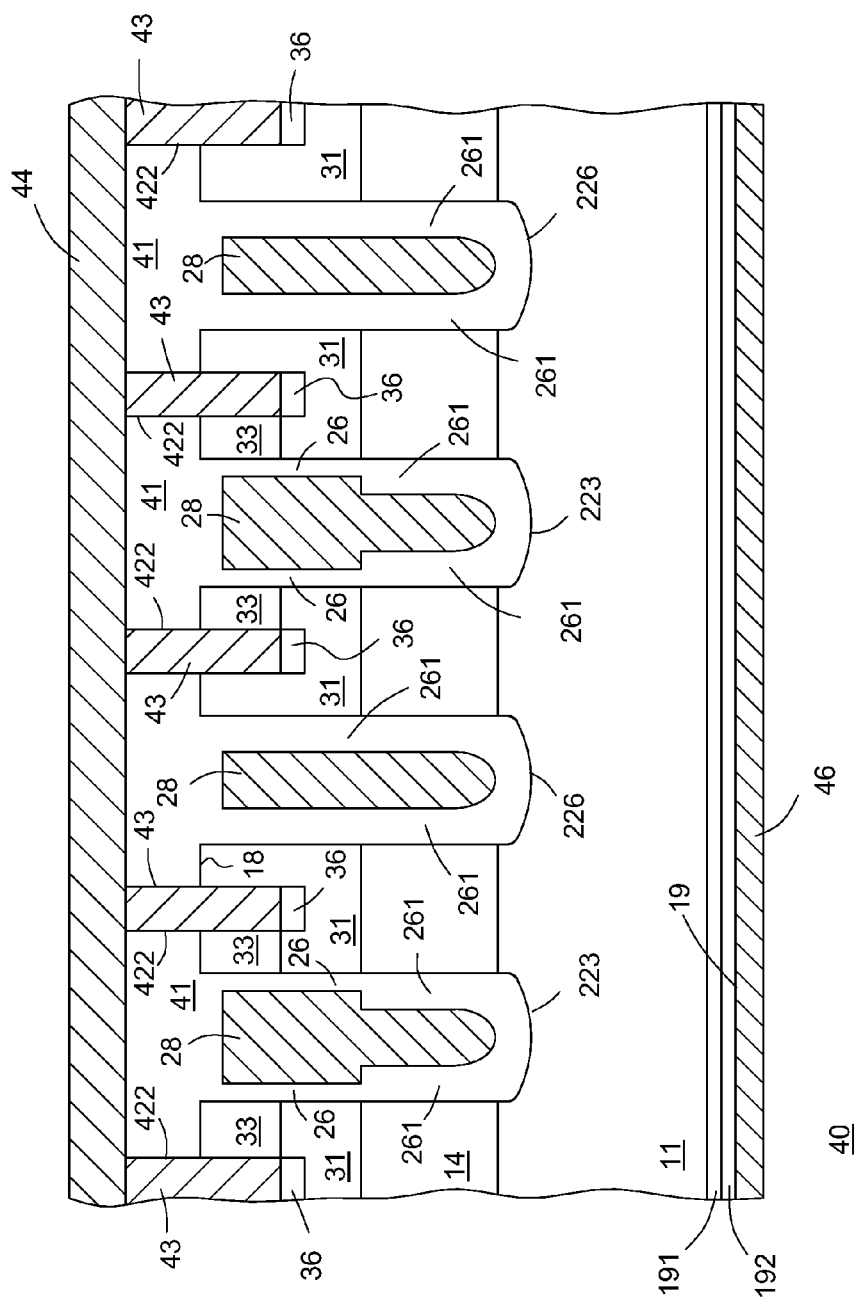
FIG. 18 illustrates a partial cross-sectional view of a portion of a semiconductor device in accordance with another embodiment of the present invention.

FIG. 18 illustrates a partial cross-sectional view of a device 40 in accordance with another embodiment at a later stage of fabrication. Device 40 illustrates an embodiment formed using the method described herein. In one embodiment, device 40 is formed having trench gate structure 223 and trench electrode structure 226. Also, in device 40 regions 33 can be masked-out in regions adjacent to trench electrode structures 226 during fabrication, which can improve latch-up robustness.

Figure 19:
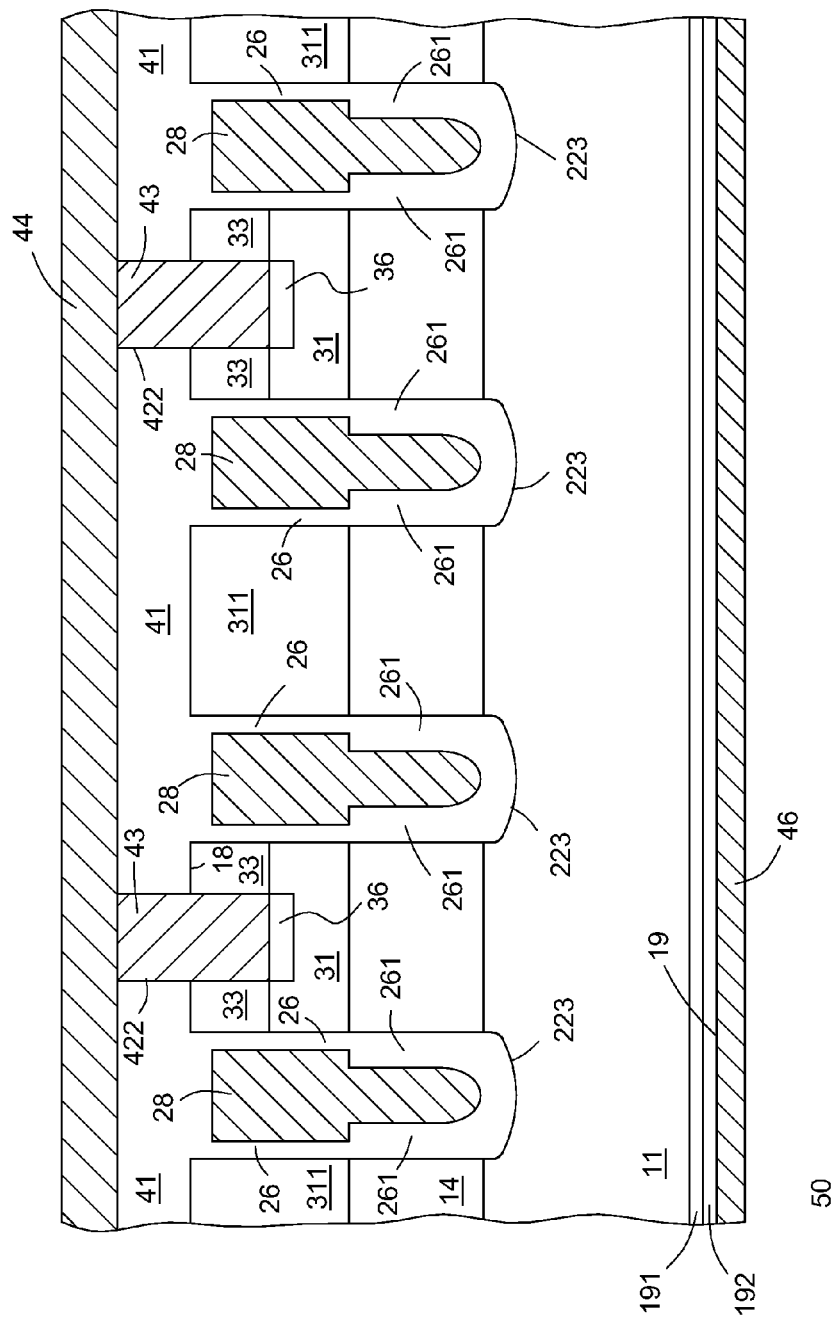
FIG. 19 illustrates a partial cross-sectional view of a portion of a semiconductor device in accordance with a further embodiment of the present invention.

FIG. 19 illustrates a partial cross-sectional view of a device 50 in accordance with a further embodiment at a later stage of fabrication. Device 50 illustrates an embodiment formed using the method described herein. In device 50 trench electrode structure 226 can be omitted and portions 311 of a region 31 between adjacent cells can be formed with regions 33 or conductive region 43 masked-out during fabrication. In an alternative embodiment, trench gate structures 223 in device 50 can be replaced with trench gate structures 224.

Figure 20:
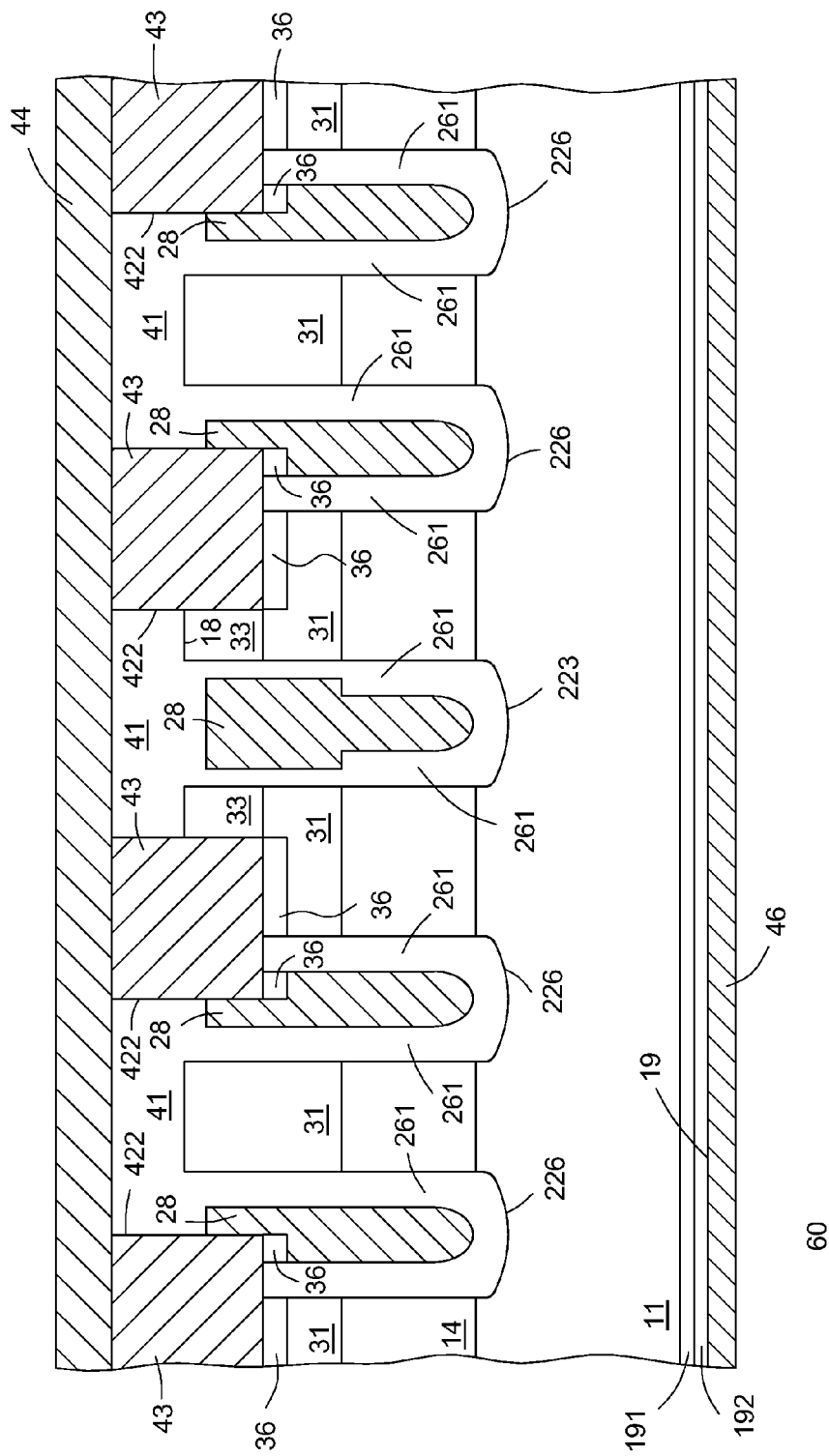
FIG. 20 illustrates a partial cross-sectional view of a portion of a semiconductor device in accordance with another embodiment of the present invention.

FIG. 20 illustrates a partial cross-sectional view of a device 60 in accordance with another embodiment at a later stage of fabrication, which can include trench gate structures 223 and trench electrode structures 226. Device 60 illustrates an embodiment formed using the method described herein. In one embodiment, trench electrode structures 226 can be connected to emitter electrodes 44 to form a shield electrode configuration. In one embodiment, a portion of regions 36 can be formed in parts of trench electrode structures 226 as illustrated in FIG. 20. In another embodiment, portions of region 31 in between trench electrode structures 226 can be formed with regions 33 or contact 43 masked-out during fabrication, and every other portion of 31 can be left floating like regions 311 as illustrated in FIG. 19.

Figure 21:
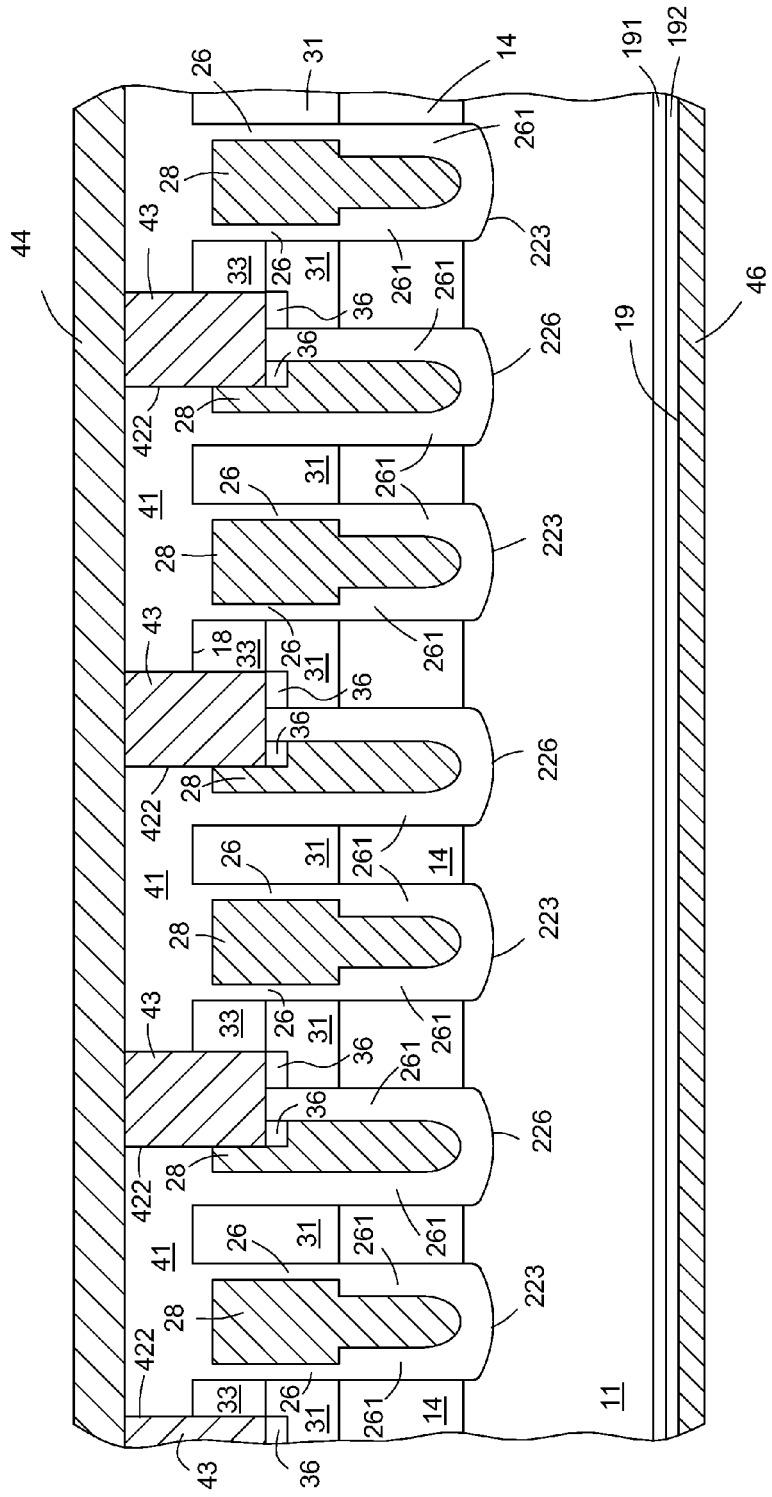
FIG. 21 illustrates a partial cross-sectional view of a portion of a semiconductor device in accordance with a further embodiment of the present invention.

FIG. 21 illustrates a partial cross-sectional view of a device 70 in accordance with a further embodiment at a later stage of fabrication, which can include trench gate structures 223 and trench electrode structures 226. Device 70 illustrates an embodiment formed using the method described herein. In one embodiment, regions 33 or conductive region 43 can be masked-out during fabrication, and can be omitted on one side of trench gate structures 223 and every other portion of region 31 can be left floating like regions 311 illustrated in FIG. 19). In one embodiment, trench electrodes structures 226 can be connected to emitter electrodes 44 to form a shield electrode configuration. In one embodiment, a portion of regions 36 can be formed in parts of trench electrode structures 226 as illustrated in FIG. 21.

Figure 22:
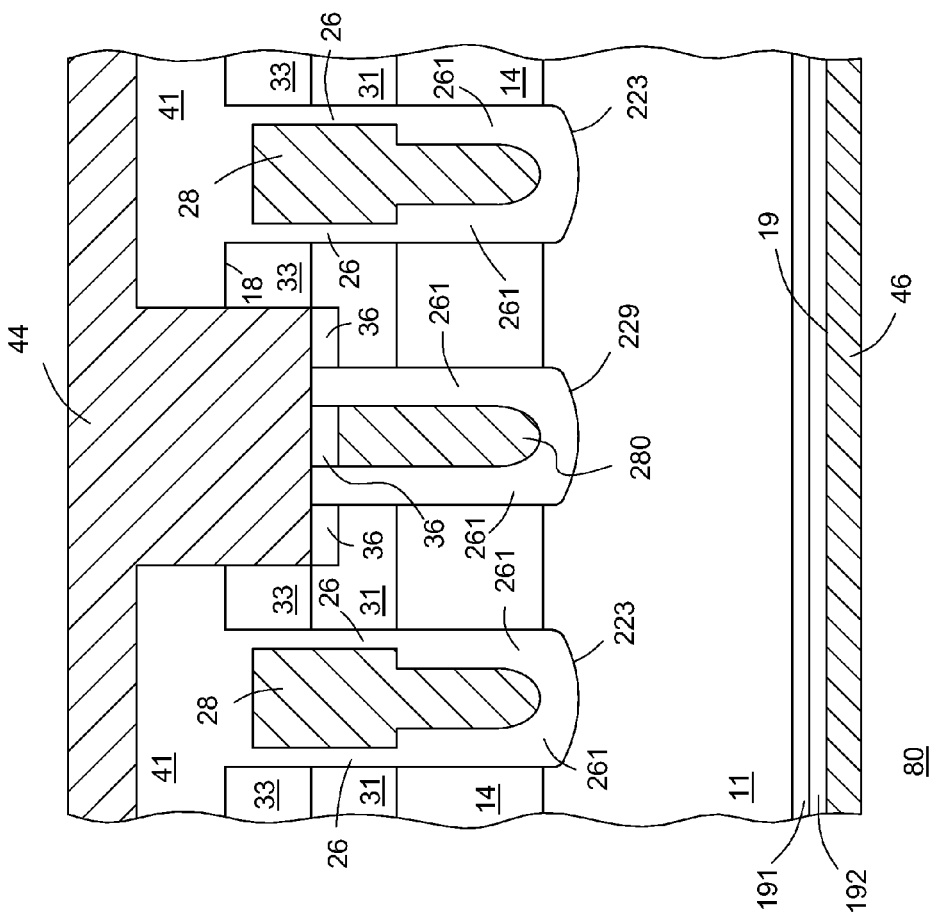
FIG. 22 illustrates a partial cross-sectional view of a portion of a semiconductor device in accordance with another embodiment of the present invention.

FIG. 22 illustrates a partial cross-sectional view of a device 80 in accordance with another embodiment at a later stage of fabrication. Device 80 illustrates an embodiment formed using the method described herein. In one embodiment, device 80 is formed having trench gate structures 223 as described in conjunction with device 30. In accordance with the present embodiment, device 80 further has a trench electrode structure 229 formed between trench gate structures 223. In the present embodiment, trench electrode structure 229 can be formed having layer 261 along all surfaces of a conductive electrode 280, which is further connected to emitter electrode 44 as illustrated in FIG. 22. In one embodiment, conductive electrode 280 can be formed when gate electrode 28 is formed. In accordance with the present embodiment, trench electrode structure 229 can be configured as a shield electrode or field plate structure. In accordance with the present embodiment, trench electrode 229 can be formed using a photomasking step.

Figure 23:
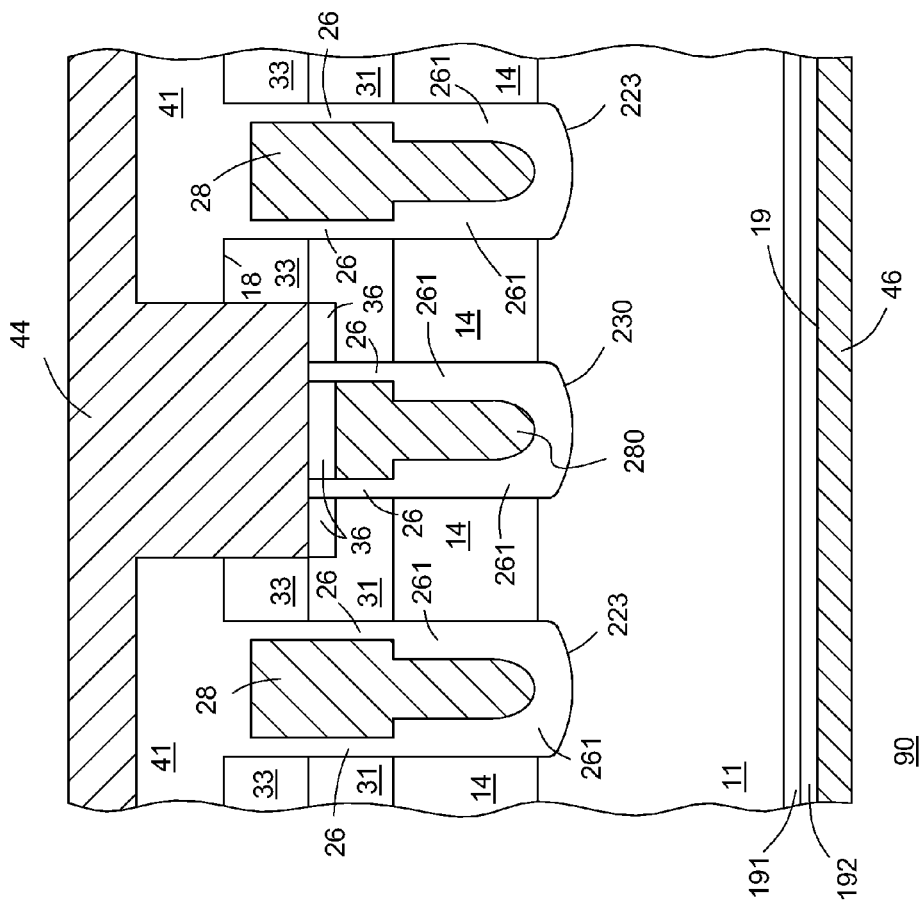
FIG. 23 illustrates a partial cross-sectional view of a portion of a semiconductor device in accordance with a further embodiment of the present invention.

FIG. 23 illustrates a partial cross-sectional view of a device 90 in accordance with another embodiment at a later stage of fabrication. Device 90 illustrates an embodiment formed using the method described herein. In one embodiment, device 90 can be formed having trench gate structures 223 as described in conjunction with device 30. In accordance with the present embodiment, device 90 can further have a trench electrode structure 230 formed between trench gate structures 223. In the present embodiment, trench electrode structure 230 can be formed having layer 261 along lower surfaces of conductive electrode 280 and layers 26 along upper surfaces of conductive electrode 280, which can be further connected to emitter electrode 44. In one embodiment, conductive electrode 280 can be formed when gate electrode 28 is formed. In accordance with the present embodiment, trench electrode structure 230 can be configured as a shield electrode or field plate structure. In accordance with the present embodiment, the device 90 can be formed without a masking step (that is, photo exposure without a mask).

FIGS. 24-27 illustrate partial cross-sectional views of a device 99 in accordance with another embodiment at various stages of fabrication. In one embodiment, device 99 can be configured as an IGFET device having a trench shield electrode. In one embodiment, device 60 includes a region of semiconductor material, semiconductor substrate, or semiconductor region 112, which can be, for example, an n-type silicon substrate 111 having a resistivity ranging from about 0.001 ohm-cm to about 0.005 ohm-cm. By way of example, substrate 111 can be doped with phosphorous, arsenic, or antimony. In the embodiment illustrated, substrate 111 provides a drain region, drain contact, or a first current carrying contact for device 60.

Figure 24:
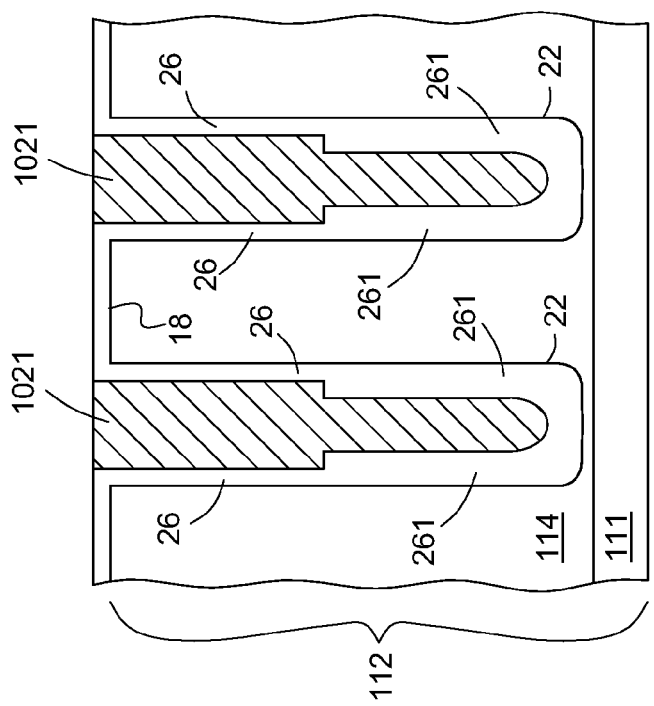

A semiconductor layer, drift region, or extended drain region 114 can be formed in, on, or overlying substrate 111. In one embodiment, semiconductor layer 114 can be formed using semiconductor epitaxial growth techniques. Alternatively, semiconductor layer 114 can be formed using semiconductor doping and diffusion techniques. In an embodiment suitable for a 50 volt device, semiconductor layer 114 can be n-type with a dopant concentration of about $1.0 \times 10^{16}$ atoms/cm$^3$ to about $1.0 \times 10^{17}$ atoms/cm$^3$ and can have a thickness from about 3 microns to about 5 microns. The dopant concentration and thickness of semiconductor layer 114 can be increased or decreased depending on the desired drain-to-source breakdown voltage (BV$_{DSS}$) rating of device 99. In one embodiment, semiconductor layer 114 can have graded dopant profile. In one embodiment, semiconductor layer 114 can have a dopant profile that provides a region of higher dopant concentration in proximity to where the drain end of the channel regions of device 99 meets semiconductor layer 114. In one embodiment, device 99 can be processed in a similar manner as device 10 as described in conjunction with FIGS. 1-8, except that the formation of JFET region 14 may be skipped and that region 31 can formed at later step as described hereinafter and designated as body region 310. As illustrated in FIG. 24, device 99 can include trenches 22 extending from major surface 18 and can be formed with layers 261 and 26 as described previously. In one embodiment, a layer of material can be formed overlying major surface 18 and within trenches 22 along layers 261 and 26. In one embodiment, the layer of material can be a crystalline semiconductor material, a conductive material, or combinations thereof. In one embodiment, the layer of material can be doped polysilicon. In one embodiment, the polysilicon can be doped with an n-type dopant, such as phosphorous or arsenic. In a subsequent step, the layer of material can be planarized to form intermediate structures 1021 within trench structures 22 as illustrated in FIG. 24. In one embodiment, chemical mechanical polishing techniques can be used for the planarization step. When the layer of material includes crystalline semiconductor material, the layer of material can be heat treated before or after planarization to, for example, activate and/or diffuse any dopant material present in the crystalline semiconductor material.

Figure 25:
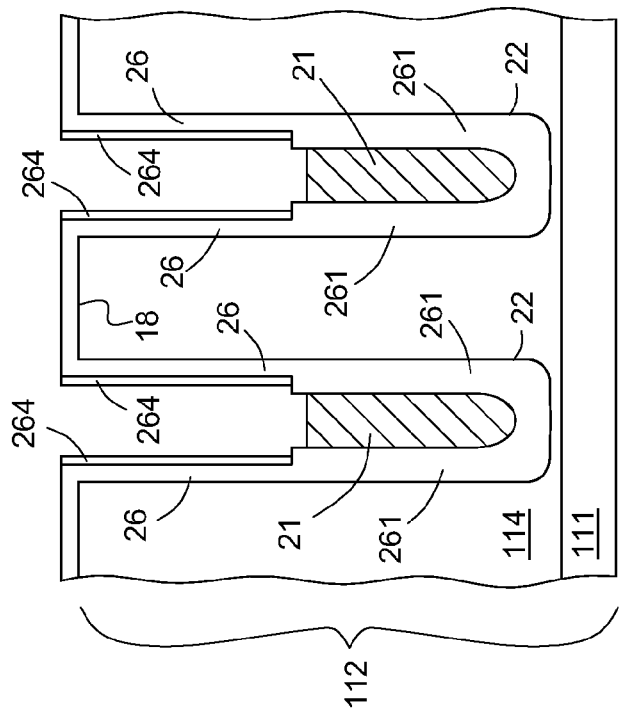
FIGS. 24-27 illustrate partial cross-sectional view of a portion of a semiconductor device at various stages of fabrication in accordance with another embodiment of the present invention.

FIG. 25 illustrates a partial cross-sectional view of device 99 after additional processing. In one embodiment, intermediate structures 1021 can be further recessed within trench structures 22 to form shield electrodes 21. As an example, a dry etch with a fluorine or chlorine based chemistry can be used for the recess step when shield electrodes 21 include a crystalline semiconductor material. In accordance with the present embodiment, shield electrodes 21 are recessed within trench structures 22 below layers 261. In an optional step, spacers 264 can be formed along layers 26 to protect layers 26 during subsequent processing. In one embodiment spacers 264 can be a nitride material. In one embodiment, spacers 264 can have a thickness from about 0.015 microns to about 0.02 microns.

Figure 26:
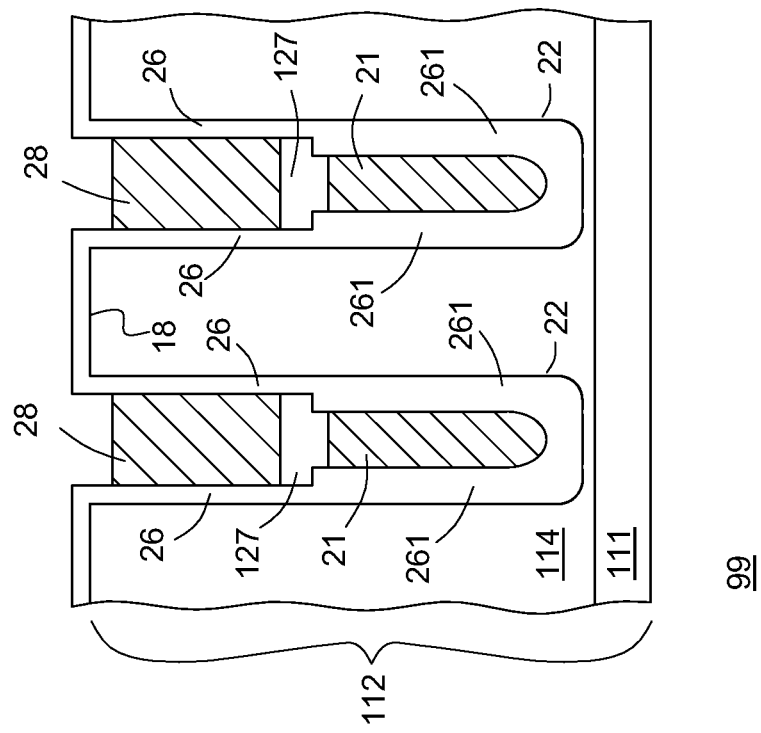

FIG. 26 illustrates a partial cross-section view of device 99 after additional processing. In one embodiment, layers 127 can be formed adjacent shield electrodes 21. In one embodiment, layers 127 can comprise a dielectric or insulative material and are configured, for example, as interpoly dielectric layers or inter-electrode dielectric layers. In one embodiment, layers 127 can comprise a silicon oxide formed using thermal oxidation techniques. In one embodiment, layers 127 can have a thickness from about 0.1 microns to about 0.3 microns.

Subsequently, spacers 264 can be removed and a layer of material can be formed overlying major surface 18 and within trench structures 22. In one embodiment, the layer of material can be a crystalline semiconductor material, a conductive material, or combinations thereof. In one embodiment, the layer of material can be doped polysilicon. In one embodiment, the polysilicon can be doped with an n-type dopant, such phosphorous or arsenic. Subsequently, the layer of material can be planarized using layer 26 as a stop layer. In one embodiment, chemical mechanical planarization can be used for the planarization step. The planarization step can be used to form gate electrodes 28 within trench structures 22 as illustrated in FIG. 26. In an optional step, gate electrodes 28 can be further recessed within trenches 22 below major surface 18.

Figure 27:
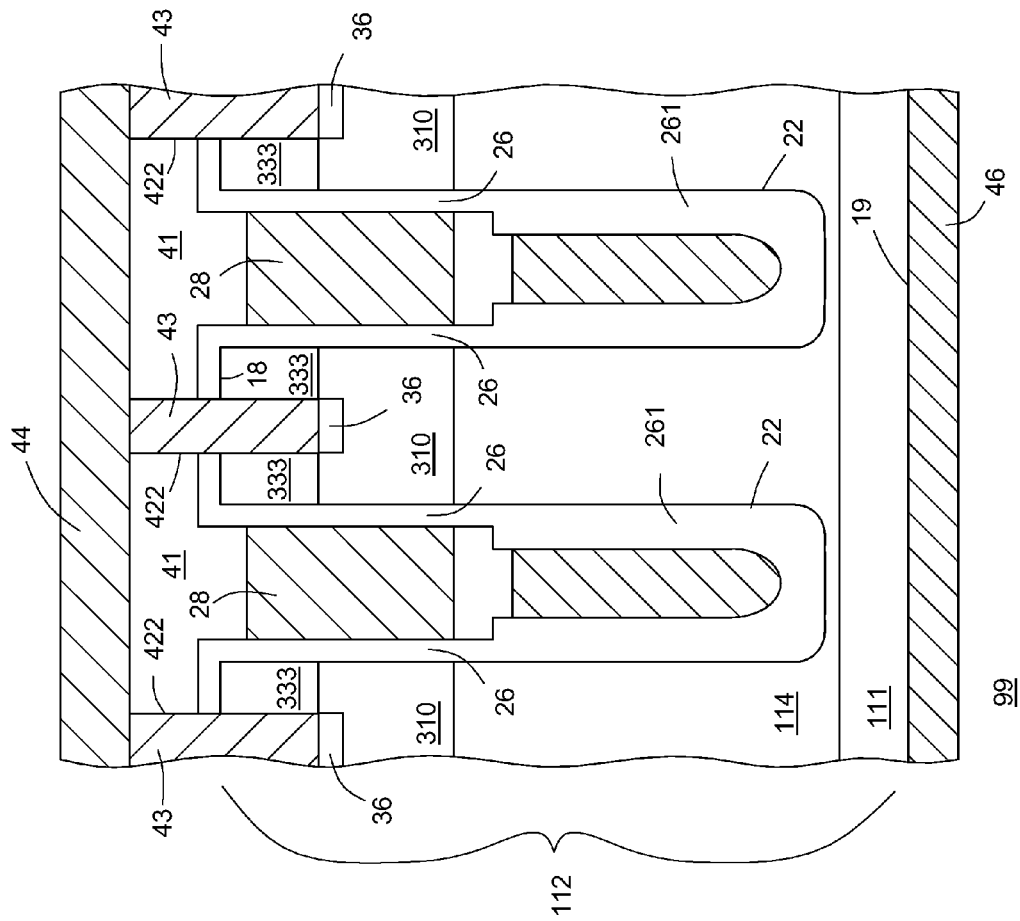

FIG. 27 illustrates a partial cross-section view of device 99 after further processing. In one embodiment, body, base, or doped regions 310 can be formed extending from major surface 18 adjacent trench structures 22. Body regions 310 can have a conductivity type that is opposite that of semiconductor layer 114. In one embodiment, body regions 310 can have p-type conductivity and can be formed using, for example, a boron dopant source. Body regions 310 have a dopant concentration suitable for forming inversion layers that operate as conduction channels or channel regions of device 99. Body regions 310 can extend from major surface 18 to a depth, for example, of about 0.5 microns to about 2.0 microns. It is understood that body regions 310 can be formed at an earlier stage of fabrication, for example, before trenches 22 are formed. Body regions 310 can be formed using doping techniques, such as ion implantation and anneal techniques.

In a subsequent step, a masking layer (not shown) can be formed overlying portions of major surface 18. In one embodiment, source regions, current conducting regions, or current carrying regions 333 can be formed within, in, or overlying body regions 310 and can extend from major surface 18 to a depth, for example, of about 0.1 microns to about 0.5 microns. In one embodiment, source regions 333 can have n-type conductivity and can be formed using, for example, a phosphorous or arsenic dopant source. In one embodiment, an ion implant doping process can be used to form source regions 333 within body regions 310. The masking layer can then be removed, and the implanted dopant can be annealed. In one embodiment, device 99 can be further processed in accordance with the method described in conjunction with FIG. 9 to obtain the structure illustrated in FIG. 27. However, in this embodiment, conductive layer 46 can be formed without aluminum.

From all of the foregoing, one skilled in the art can determine that according to one embodiment, a method of forming an insulated gate semiconductor device comprises the steps of providing a region of semiconductor material (for example, elements 11, 112) having a major surface (for example, element 18). The method includes forming a first trench (for example, elements 22, 2201, 2202) extending from the major surface into the region of semiconductor material and forming a first dielectric layer (for example, element 261) overlying surfaces of the first trench. The method includes forming a photosensitive layer (for example, element 63) overlying the first dielectric layer, wherein the photosensitive layer is configured to protect at least a portion of the first dielectric layer along lower surfaces of the first trench. The method includes removing at least a portion of the first dielectric layer from at least one upper sidewall surface (for example, element 221) of the first trench and removing the photosensitive layer. The method includes forming a second dielectric layer (for example, element 26) along the at least one upper sidewall surface, wherein the first and second dielectric layers have different thicknesses. The method includes forming a first conductive electrode (for example, element 28, 280, 21) along at least one of the first and second dielectric layers.

Those skilled in the art will also appreciate that, according to another embodiment, the step of forming the first conductive electrode can include forming the first conductive electrode (for example, elements 28, 280) overlying surfaces of the first and second dielectric layer, and wherein the second dielectric layer is thinner than the first dielectric layer.

Those skilled in the art will also appreciate that, according to another embodiment, the step of forming the first conductive electrode can include forming the first conductive electrode (for example, element 21) along surfaces of the first dielectric layer, the method further comprising the steps of forming a third dielectric layer (for example, element 127) overlying the first conductive electrode, and forming a second conductive electrode (for example, element 28) along surfaces of the second dielectric layer, wherein the second conductive electrode is configured as a gate electrode, and wherein the first conductive electrode is configured as a shield electrode.

Those skilled in the art will also appreciate that, according to still another embodiment, an insulated gate semiconductor device comprises a region of semiconductor material (for example, elements 11, 112) having a major surface (for example, element 18). A first trench (for example, elements 22, 223, 224, 230 2201, 2202) extends from the major surface. A second trench (for example, elements 22, 223, 224, 230, 2201, 2202) extends from the major surface and is spaced apart from the first trench. A first dielectric layer (for example, element 261) is formed along lower surfaces of both the first and second trenches and at least a portion of a first upper surface of both the first and second trenches. A second dielectric layer (for example, element 26) is formed along at least a portion of a second upper surface (for example, element 221) of both the first and second trenches, wherein the second dielectric layer is thinner than the first dielectric layer. A first conductive electrode (for example, element 28, 280) is formed within the first trench along the first and second dielectric layers. A second conductive electrode (for example, elements 28, 280) is formed within the second trench along the first and second dielectric layers, wherein the first and second conductive electrodes and the second dielectric layer are configured to control a channel region within the region of semiconductor material.

Those skilled in the art will also appreciate that, according to another embodiment, the second upper surface is opposite to the first upper surface, and wherein the first upper surface has alternating portions (for example, elements 221, 222) comprising the first dielectric layer and the second dielectric layer, and wherein the device further comprises a first doped region (for example, element 31, 311) formed adjacent the first trench and configured to form the channel.

Those skilled in the art will also appreciate that, according to another embodiment, the structure can further include a third trench (for example, elements 22, 223, 224, 226, 229, 230, 2201, 2202) extending from the major surface between the first and second trenches, which can include the first dielectric layer (for example, element 261) formed along surfaces of third trench and a third electrode (for example, element 28, 280) formed within the third trench.

Those skilled in the art will also appreciate that, according to another embodiment, the third electrode (for example, element 280) can be configured as a shield electrode.

Those skilled in the art will also appreciate that, according to yet another embodiment, a method for forming a semiconductor device comprises providing a region of semiconductor material (for example, element 11, 112) having a major surface (for example, element 18). The method includes forming a first and second trenches (for example, elements 22, 223, 224, 230, 2201, 2202) extending from the major surface and spaced apart and forming a first doped region (for example, elements 31, 311) within the region of semiconductor material. The method includes forming a first layer (for example, element 261) along surfaces of the first and second trenches and along the major surface and forming a photosensitive layer (for example, element 63) overlying the first layer. The method includes forming openings (for example, elements 1379, 1380) in the photosensitive layer to expose the first layer along portions of upper sidewall surfaces (for example, element 221) of the first and second trenches and along portions of the major surface. The method includes reducing the thickness of the exposed portions (for example, elements 2610, 2611) of the first layer, wherein other portions of the first layer remain along lower surfaces of the first and second trenches and the major surface. The method includes forming a second layer (for example, element 26) where the first layer was reduced in thickness, wherein the second layer is thinner than the first layer. The method includes forming conductive electrodes (for example, elements 28, 280) in the first and second trenches along the first and second layers.

Those skilled in the art will also appreciate that, according to a still further embodiment, the step of forming the openings can include forming a plurality of openings (for example, elements 1380) that are spaced apart along upper sidewall surfaces of the first and second trenches, and wherein at least one opening exposes adjoining portions of the upper sidewall of the first trench, the major surface, and the upper sidewall surface the second trench.

Those skilled in the art will also appreciate that, according to another embodiment, the step of forming the photosensitive layer can include forming a positive photoresist layer, and wherein forming the openings includes exposing portions of the positive photoresist layer to a light source (for example, element 67) through a mask (for example, element 137) and developing the exposed portions.

Those skilled in the art will also appreciate that, according to a still further embodiment, a method for forming an insulated gate semiconductor device comprises forming a trench (for example, elements 22, 223, 224, 230) extending from a major surface (for example, element 18) of a region of semiconductor material (for example, elements 11, 112). The method includes forming a first dielectric layer (for example, element 261) along surfaces of the trench. The method includes providing a patterned layer (for example, elements 63, 137, 138, 631) overlying the first dielectric layer including a plurality of laterally spaced apart openings (for example, elements 1380) along an upper surface (for example, element 221) of the trench. The method includes reducing thickness of the first dielectric layer through the openings while leaving other portions of the first dielectric layer in place along other surfaces (for example, element 222) of the trench adjacent the openings. The method includes forming a second dielectric layer (for example, element 26) along those portions (for example, element 221) of the trench where the first dielectric layer was reduced in thickness. The method includes forming a control electrode (for example, element 28) adjacent the first and second dielectric layers within the trench, wherein the second dielectric layer is configured as a gate dielectric layer and the first dielectric layer is thicker than the second dielectric layer.

In view of all the above, it is evident that a novel method and structure are disclosed. Included, among other features, is a trench-electrode structure that includes portions of thick and thin dielectric material. A photosensitive layer can be selectively exposed and developed, portions of a thick dielectric layer formed with a trench can be selectively removed or reduced in thickness, and a thin dielectric layer can be formed where the thick dielectric layer was removed. The thick dielectric layer is configured to provide an IGFET device with reduce gate electrode capacitance and to reduce related switching losses. The method is flexible and provides a number of different trench electrode structures even within a single device. The method includes a photoresist exposure and development technique that can be implemented with existing processing equipment and materials, which makes the method cost effective.

While the subject matter of the invention is described with specific preferred embodiments and example embodiments, the foregoing drawings and descriptions thereof depict only typical embodiments of the subject matter and are not therefore to be considered limiting of its scope. It is evident that many alternatives and variations will be apparent to those skilled in the art. For example, the subject matter has been described for a particular n-channel IGBT and MOSFET structures even though the method and structure is directly applicable to other MOS transistors as well as bipolar, BiCMOS, metal semiconductor FETs (MESFETs), HFETs, thyristors bi-directional transistors, and other transistor structures.

As the claims hereinafter reflect, inventive aspects may lie in less than all features of a single foregoing disclosed embodiment. Thus, the hereinafter expressed claims are hereby expressly incorporated into this Detailed Description of the Drawings with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A method of forming an insulated gate semiconductor device comprising the steps of:
   providing a region of semiconductor material having a major surface;
   forming a first trench extending from the major surface into the region of semiconductor material;
   forming a first dielectric layer overlying surfaces of the first trench;
   forming a photosensitive layer overlying the first dielectric layer;
   exposing the photosensitive layer to an energy source to form a soluble portion of the photosensitive layer and a non-soluble portion of the photosensitive layer, wherein the soluble portion is adjacent at least a portion of the first dielectric layer on at least one upper sidewall surface of the first trench;
   removing the soluble portion in a solution to expose the first dielectric layer on at least one upper sidewall surface of the first trench;
   removing the exposed portion of the first dielectric layer from the at least one upper sidewall surface of the first trench;
   removing the non-soluble portion of the photosensitive layer;
   forming a second dielectric layer along the at least one upper sidewall surface, wherein the first and second dielectric layers have different thicknesses; and
   forming a first conductive electrode along at least one of the first and second dielectric layers.

2. The method of claim 1, wherein forming the first conductive electrode comprises forming the first conductive electrode overlying surfaces of the first and second dielectric layer, and wherein the second dielectric layer is thinner than the first dielectric layer.

3. The method of claim 1, wherein forming the first conductive electrode comprises forming the first conductive electrode along surfaces of the first dielectric layer, the method further comprising the steps of:
   forming a third dielectric layer overlying the first conductive electrode, and
   forming a second conductive electrode along surfaces of the second dielectric layer, wherein the second conductive electrode is configured as a gate electrode, and wherein the first conductive electrode is configured as a shield electrode.

4. The method of claim 1, wherein removing the exposed portion of the first dielectric layer comprises removing a portion of the first dielectric layer from a first upper sidewall surface while leaving the first dielectric layer along a second upper sidewall surface of the first trench opposite to the first upper sidewall, and wherein forming the second dielectric layer comprises forming the second dielectric layer along the first upper sidewall surface.

5. The method of claim 1, wherein forming the first conductive electrode comprises forming a gate electrode, and wherein removing the exposed portion of the first dielectric layer comprises removing portions of the first dielectric layer from opposing sidewall surfaces of the first trench.

6. The method of claim 1 further comprising:
   forming a second trench extending from the major surface;
   forming the first dielectric layer along surfaces of the second trench; and
   forming the photosensitive layer along surfaces of the first dielectric layer within the second trench.

7. The method of claim 6, wherein removing the exposed portion of the first dielectric layer comprises removing the first dielectric layer from at least one upper sidewall surface of the first trench without removing the first dielectric layer from the second trench.

8. The method of claim 7 further comprising:
   forming a second conductive electrode within the second trench;
   forming a base region adjacent both the first and second trenches; and
   forming an emitter region adjacent the first trench, but not the second trench.

9. The method claim 8 further comprising forming an emitter electrode coupled to the emitter region and the second conductive electrode.

10. The method of claim 1, wherein removing the exposed portion of the first dielectric layer includes removing the first dielectric layer from both upper sidewall surfaces of the first trench, and wherein forming the second dielectric layer comprises forming the second dielectric layer along both upper sidewall surfaces of the first trench, and wherein the method further comprises:
   forming first and second base regions adjacent opposite sides of the first trench;
   forming an emitter region in the first base region, but not the second base region; and
   forming a conductive contact to the emitter region and the first base region, but not the second base region.

11. The method of claim 1, wherein removing the exposed portion of the first dielectric layer includes removing the first dielectric layer from only one sidewall surface of the first trench, and wherein forming the second dielectric layer comprises forming the second dielectric layer along the only one sidewall surface of the first trench, and wherein the method further comprises:
   forming first and second base regions adjacent opposite sides of the first trench; and forming an emitter region in the first base region adjacent the second dielectric layer, but not the second base region trench.

12. The method of claim 11 further comprising forming a conductive contact to the emitter region and the first base region, but not the second base region.

13. The method of claim 1, wherein forming the first dielectric layer comprises forming the first dielectric layer overlying the major surface, and wherein removing the exposed portion of the first dielectric layer comprises removing at least a portion of the first dielectric layer overlying at least a portion of the major surface.

14. The method of claim 1, wherein exposing the photosensitive layer to an energy source comprises exposing the photosensitive layer to an ultra-violet light source at a dose from about 100 milli-Joules/cm$^2$ to about 1000 milli-Joules/cm$^2$.

15. The method of claim 1, wherein exposing the photosensitive layer to an energy source comprises exposing the photosensitive layer to an ultra-violet light source for duration between about 100 milli-seconds to about 2000 milli-seconds.

16. the method of claim 1, wherein forming the photosensitive layer comprises forming a positive photoresist layer.

17. A method for forming a semiconductor device comprising:
    providing a region of semiconductor material having a major surface;
    forming a first trench and a second trench both extending from the major surface and spaced apart;
    forming a first doped region within the region of semiconductor material;
    forming a first layer along surfaces of the first and second trenches and along the major surface;
    forming a photosensitive layer overlying the first layer;
    forming openings in the photosensitive layer to expose the first layer along first portions of upper sidewall surfaces of the first and second trenches and along portions of the major surface;
    reducing the thickness of the exposed portions of the first layer, wherein other portions of the first layer remain along lower surfaces of the first and second trenches, remain along second portions of the upper sidewall surfaces, and remain along the major surface;
    forming a second layer where the first layer was reduced in thickness, wherein the second layer is thinner than the first layer; and
    forming conductive electrodes in the first and second trenches along the first and second layers.

18. The method of claim 17, wherein forming the openings includes forming a plurality of openings that are spaced apart along upper sidewall surfaces of the first and second trenches, and wherein at least one opening exposes adjoining portions of the upper sidewall of the first trench, the major surface, and the upper sidewall surface the second trench.

19. The method of claim 17, wherein forming the photosensitive layer includes forming a positive photoresist layer, and wherein forming the openings includes exposing portions of the positive photoresist layer to a light source through a mask and developing the exposed portions.

20. A method of forming an insulated gate semiconductor device comprising the steps of:
    providing a region of semiconductor material having a major surface;
    forming a first trench extending from the major surface into the region of semiconductor material;
    forming a first dielectric layer overlying surfaces of the first trench;
    forming a photosensitive layer overlying the first dielectric layer, wherein the photosensitive layer is configured to protect at least a portion of the first dielectric layer along lower surfaces of the first trench;
    removing at least a portion of the first dielectric layer from a first upper sidewall surface of the first trench while leaving the first dielectric layer along a second upper sidewall surface of the first trench opposite to the first upper sidewall surface;
    removing the photosensitive layer;
    forming a second dielectric layer along first upper sidewall surface, wherein the first and second dielectric layers have different thicknesses; and
    forming a first conductive electrode along at least one of the first and second dielectric layers.

21. The method of claim 20 further comprising the steps of
    forming a base region, wherein the base region is on opposite sides of the first trench; and
    forming an emitter region in the base region adjacent the second dielectric layer.

* * * * *